(12) United States Patent
Kim et al.

(10) Patent No.: US 12,230,685 B2
(45) Date of Patent: Feb. 18, 2025

(54) MULTI-BRIDGE CHANNEL FIELD EFFECT TRANSISTOR WITH MULTIPLE INNER SPACERS

(71) Applicant: SAMSUNG ELECTRONICS CO., LTD., Suwon-si (KR)

(72) Inventors: Sungsoo Kim, Hwaseong-si (KR); Sunhye Lee, Yongin-si (KR); Donghyun Roh, Suwon-si (KR); Koungmin Ryu, Hwaseong-si (KR); Jongmin Baek, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 493 days.

(21) Appl. No.: 17/589,178

(22) Filed: Jan. 31, 2022

(65) Prior Publication Data
US 2022/0367453 A1 Nov. 17, 2022

(30) Foreign Application Priority Data
May 11, 2021 (KR) .......................... 10-2021-0060527

(51) Int. Cl.
*H01L 29/417* (2006.01)
*H01L 29/78* (2006.01)

(52) U.S. Cl.
CPC .... *H01L 29/41791* (2013.01); *H01L 29/7851* (2013.01)

(58) Field of Classification Search
CPC .......... H01L 29/7851; H01L 29/41791; H01L 29/42392; H01L 29/78696; H01L 29/7848; H01L 29/66545; H01L 27/088; H01L 21/823481; H01L 29/165; H01L 29/41725; H01L 29/1079
See application file for complete search history.

(56) References Cited

U.S. PATENT DOCUMENTS

| | | | |
|---|---|---|---|
| 10,573,719 B2 | 2/2020 | Sun et al. | |
| 10,825,918 B2 | 11/2020 | Ching et al. | |
| 10,910,273 B2 | 2/2021 | Loubet et al. | |
| 2016/0013265 A1 | 6/2016 | Mlmaz et al. | |
| 2018/0122899 A1* | 5/2018 | Guillorn | H01L 29/66772 |
| 2019/0058051 A1* | 2/2019 | Kim | H01L 29/42392 |
| 2019/0214314 A1* | 7/2019 | Seo | H01L 29/78696 |
| 2020/0058763 A1 | 2/2020 | Chang et al. | |
| 2020/0312844 A1 | 10/2020 | Jeon et al. | |
| 2021/0057525 A1 | 2/2021 | Chiang et al. | |

* cited by examiner

*Primary Examiner* — Changhyun Yi
(74) *Attorney, Agent, or Firm* — Sughrue Mion, PLLC

(57) ABSTRACT

A semiconductor device includes active fins extending in a first direction on a substrate; an isolation insulating layer covering a portion of side surfaces of the active fins; channel layers stacked vertically and spaced apart on the active fins; a gate pattern in a second direction across the active fins and the channel layers; and spacer layers across the active fins in the second direction on both sides of the gate pattern. At least one spacer layer extends downwardly along a side surface of the gate pattern such that a lower surface thereof contacts the isolation insulating layer. The lower surface of the spacer layer is higher than a level of upper surfaces of the active fins. The gate pattern has a lower surface contacting the isolation insulating layer. The lower surface of the gate pattern is lower than a level of the upper surfaces of the active fins.

20 Claims, 38 Drawing Sheets

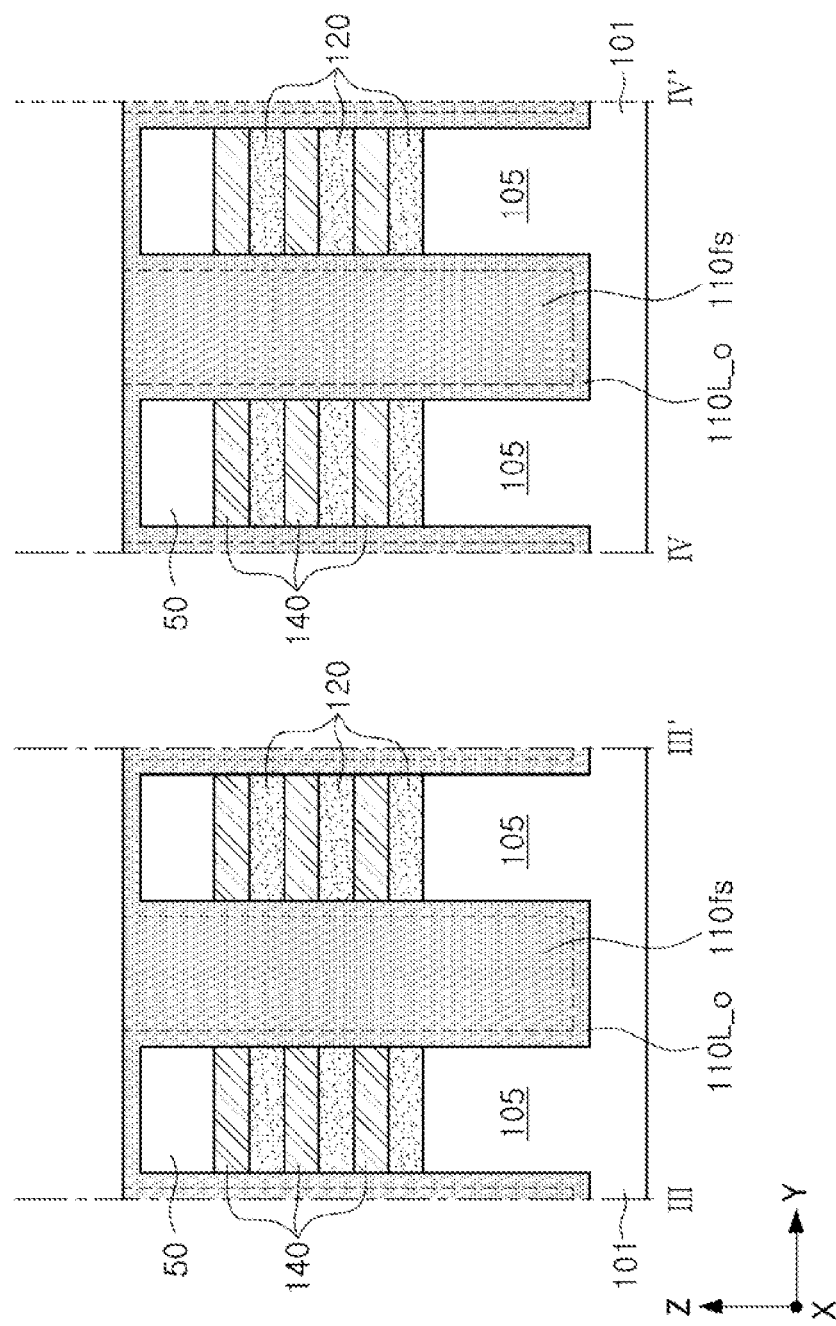

MULTI-BRIDGE CHANNEL FIELD EFFECT TRANSISTOR WITH MULTIPLE INNER SPACERS

CROSS TO REFERENCE TO RELATED APPLICATION

This application claims priority to Korean Patent Application No. 10-2021-0060527 filed on May 11, 2021 in the Korean Intellectual Property Office, the disclosure of which is incorporated by reference herein in its entirety.

BACKGROUND

Example embodiments of the present disclosure relate to a semiconductor device.

As the demand for high performance, high speed, and/or multifunctionality of a semiconductor device has increased, integration density of a semiconductor device has also increased. In manufacturing a semiconductor device having a fine pattern corresponding to the trend of high integration of the semiconductor device, it has been necessary to implement patterns having a fine width or a fine spacing. Also, to address the limitations of operation properties due to the size reduction of a planar metal oxide semiconductor FET (MOSFET), there have been attempts to develop a semiconductor device including a FinFET having a three-dimensional channel structure.

SUMMARY

On or more example embodiments of the present disclosure provide a semiconductor device having improved electrical properties and reliability.

According to an aspect of an example embodiment, a semiconductor device including: a plurality of active fins extending in a first direction on a substrate; an isolation insulating layer provided between adjacent active fins of the plurality of active fins on the substrate and covering at least a portion of side surfaces of the plurality of active fins; a plurality of channel layers stacked vertically and spaced apart from each other on the plurality of active fins; a gate pattern extending in a second direction across the plurality of active fins and the plurality of channel layers on the substrate, the gate pattern surrounding at least a portion of each of the plurality of channel layers; a plurality of spacer layers extending in the second direction across the plurality of active fins on both sides of the gate pattern; and a plurality of source/drain regions provided on the plurality of active fins on both sides of the gate pattern, each of the plurality of source/drain regions being connected to a respective one of the plurality of channel layers, wherein at least one of the plurality of spacer layers extends downwardly along a side surface of the gate pattern such that a lower surface of the at least one of the plurality of spacer layers is in contact with the isolation insulating layer, and the lower surface of the at least one of the plurality of spacer layers is at a level higher than a level of upper surfaces of the plurality of active fins, and wherein the gate pattern has a lower surface contacting the isolation insulating layer, and the lower surface of the gate pattern is at a level lower than the level of the upper surfaces of the plurality of active fins.

According to an aspect of an example embodiment, a semiconductor device includes: an active fin protruding from a substrate and extending in a first direction; an isolation insulating layer covering side surfaces of the active fin that extend in the first direction, the isolation insulating layer including a raised region having a surface at a level higher than a level of an upper surface of the active fin; a plurality of channel layers vertically provided and spaced apart from each other on the active fin; a gate pattern extending across the active fin and the plurality of channel layers in a second direction on the substrate; a spacer layer extending across the active fin in the second direction on at least one side of the gate pattern; and a source/drain region disposed on a recessed region of the active fin and connected to the plurality of channel layers on at least one side of the gate pattern, wherein the spacer layer extends downwardly along respective side surfaces of the plurality of channel layers and a lower surface of the spacer layer contacts a portion of the raised region of the isolation insulating layer, and wherein the lower surface of the spacer layer is at a level higher than the level of the upper surface of the active fin.

According to an aspect of an example embodiment, a semiconductor device includes: a first active fin and a second active fin extending in a first direction on a substrate; an isolation insulating layer provided between a side surface of the first active fin and a side surface of the second active fin facing each other; a first channel structure including a plurality of first channel layers stacked vertically and spaced apart from each other on the first active fin; a second channel structure including a plurality of second channel layers stacked vertically and spaced apart from each other on the second active fin; a gate pattern extending in a second direction across the first and second active fins, the gate pattern surrounding at least a portion of the first channel structure and at least a portion of the second channel structure; and a spacer layer extending across the first active fin and the second active fin in the second direction on both sides of the gate pattern, the spacer layer having a lower surface in contact with an upper surface of the isolation insulating layer in a region between the first active fin and the second active fin, wherein the lower surface of the spacer layer in contact with the upper surface of the isolation insulating layer is at a level higher than a level of an upper surface of at least one of the first active fin and the second active fin.

BRIEF DESCRIPTION OF DRAWINGS

The above and other aspects, features, and advantages of the disclosure will be more clearly understood from the following detailed description, taken in conjunction with the accompanying drawings, in which:

FIGS. 8, 9, 10A, 10B, 11A, 11B, 12, 13A, 13B, 14, 15A, 15B, 16A, 16B, 17, 18A, 18B, 18C, 19, 20A, 20B, 21, 22A and 22B are views illustrating processes of a method of manufacturing a semiconductor device in order according to an example embodiment.

DETAILED DESCRIPTION

Hereinafter, example embodiments of the disclosure will be described as follows with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
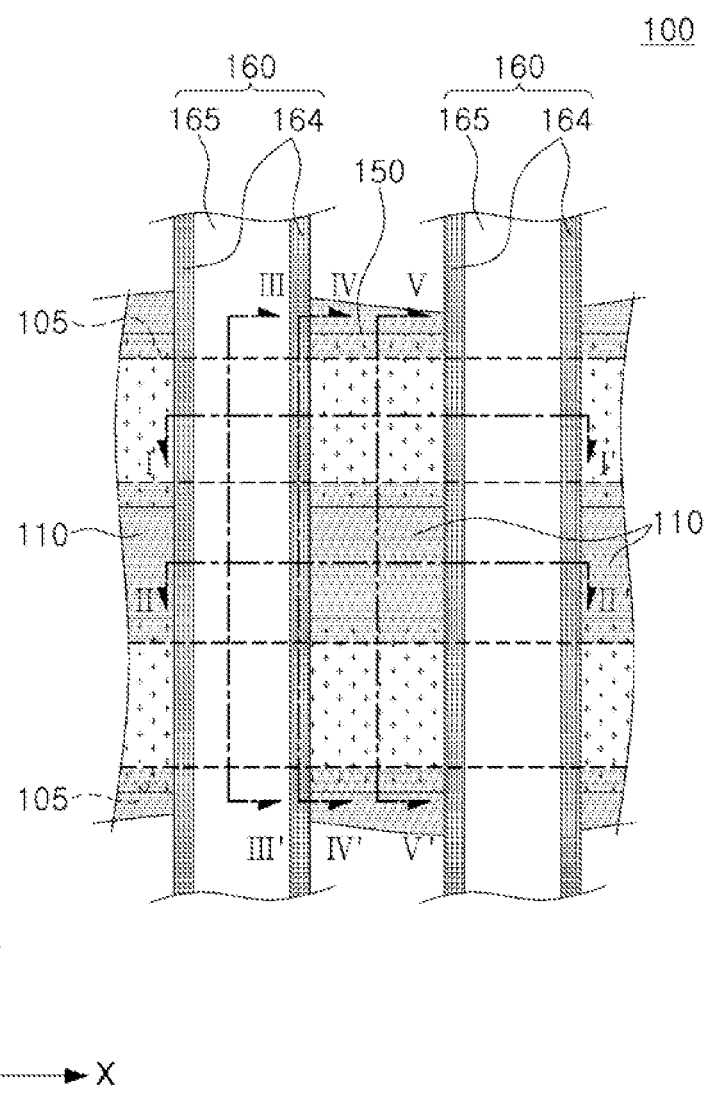
FIG. 1 is a plan view illustrating a semiconductor device according to an example embodiment.

FIG. 1 is a plan view illustrating a semiconductor device according to an example embodiment.

Figure 2A:
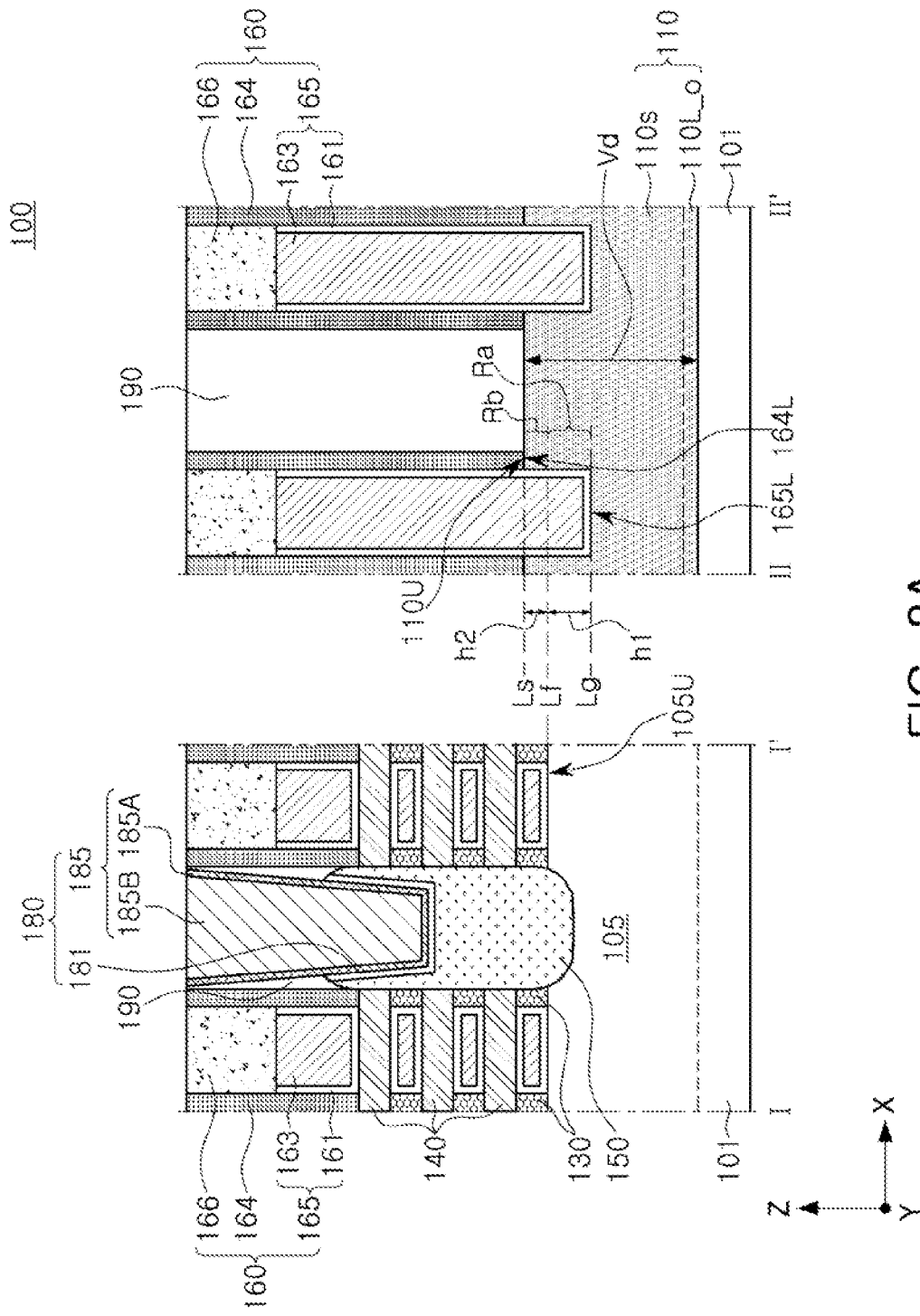
FIGS. 2A, 2B and 2C are cross-sectional views illustrating a semiconductor device according to an example embodiment.
Figure 2B:
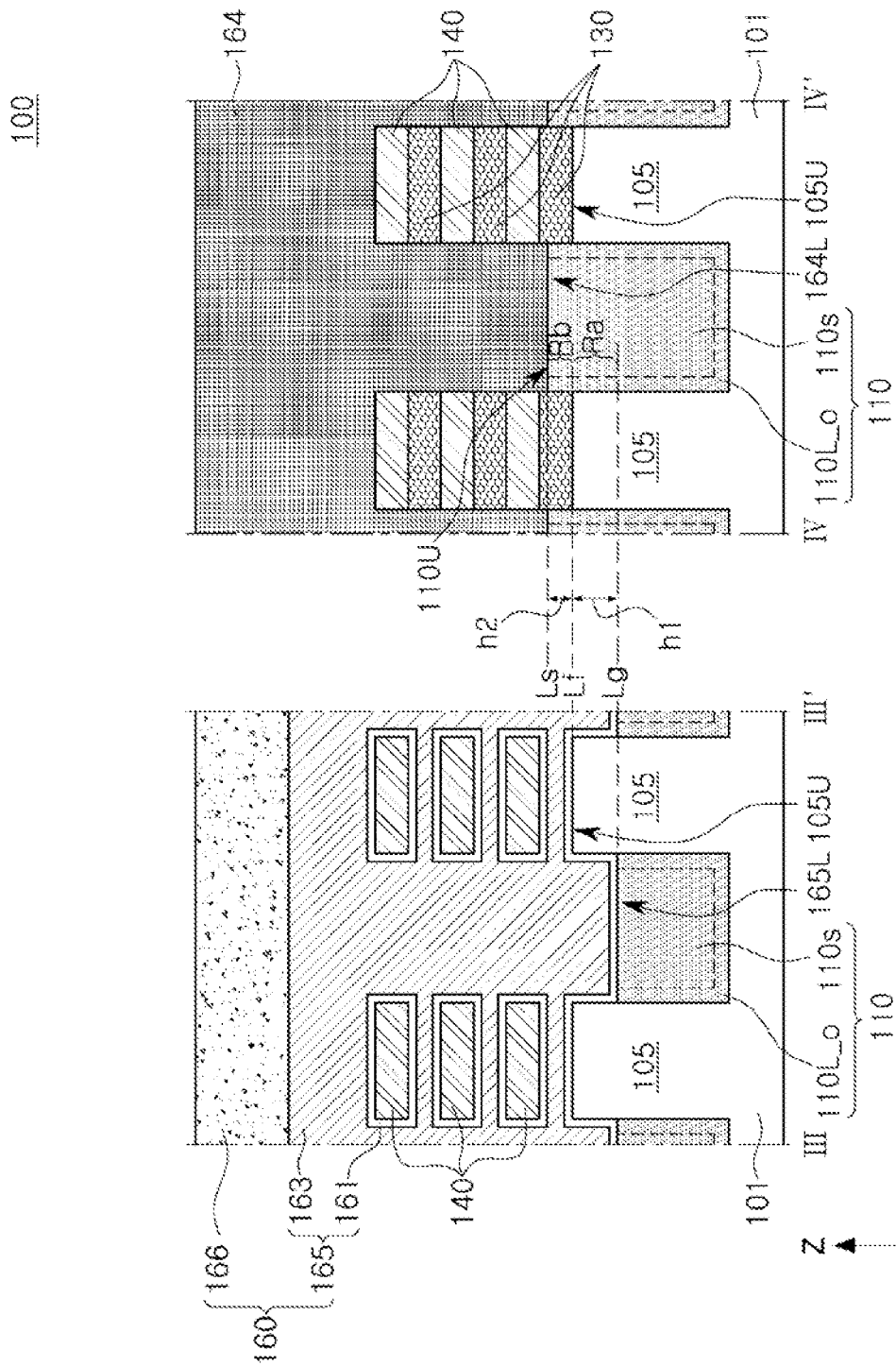
Figure 2C:
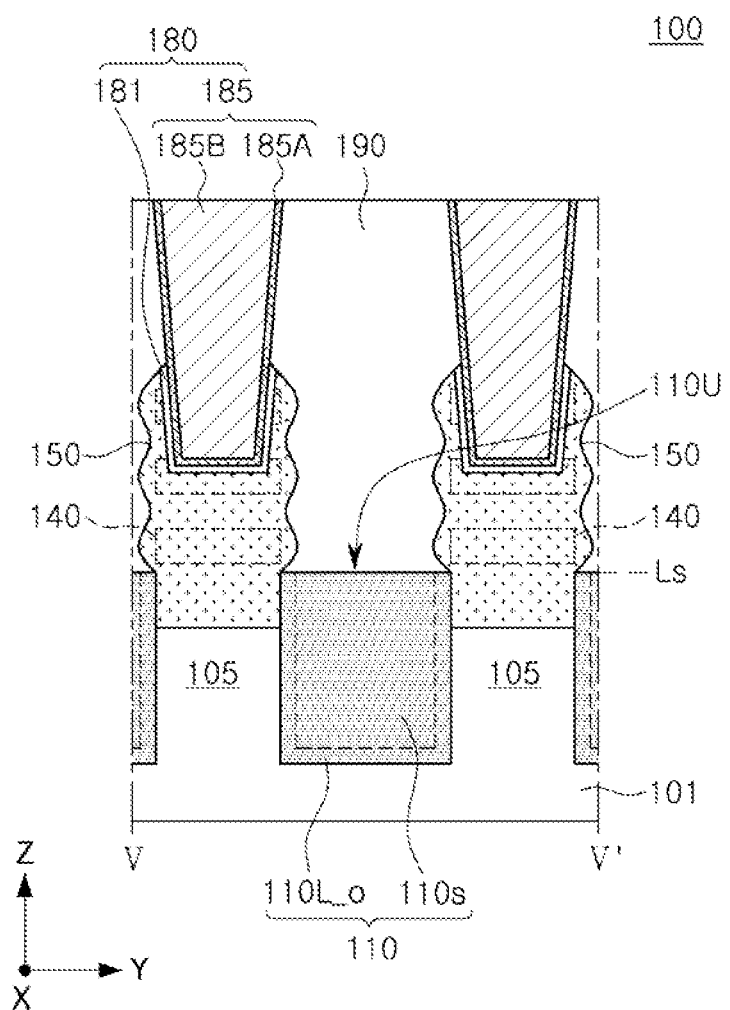

FIGS. 2A to 2C are cross-sectional views illustrating a semiconductor device according to example embodiments. FIG. 2A is cross-sectional views illustrating a semiconductor device taken along lines I-I' and II-II'. FIG. 2B is cross-sectional views illustrating a semiconductor device taken along lines III-III' and IV-IV'. FIG. 2C is cross-sectional views illustrating a semiconductor device taken along lines V-V'. FIG. 1 illustrates only major components of the semiconductor device.

With reference to FIGS. 1 to 2C, a semiconductor device 100 may include a substrate 101, active fins 105 on the substrate 101, an isolation insulating layer 110 defining the active fins 105, channel layers 140 on the active fins 105, gate structures 160 across the active fins 105, source/drain regions 150 disposed on the active fins 105 on both sides of the gate structures 160, and a contact structure 180 connected to the source/drain regions 150. Each of the gate structures 160 may include spacer layers 164, a gate pattern 165, and a gate capping layer 166. The semiconductor device 100 may further include an inner spacer layer 130 and an interlayer insulating layer 190.

In the semiconductor device 100, the active fin 105 may have a fin structure, and the gate pattern 165 may be disposed between the active fin 105 and the channel layers 140, between the channel layers 140, and on the channel layers 140. The gate pattern 165 may be disposed between adjacent ones of the source/drain regions 150 to surround the channel layers 140. Accordingly, the semiconductor device 100 may include a multi-bridge channel FET (MBCFET™) formed by the channel layers 140, the source/drain regions 150, and the gate pattern 165.

The substrate 101 may include a semiconductor material, such as a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a silicon on insulator (SOI) layer, a semiconductor on insulator (SeOI) layer, or the like.

The active fin 105 may be defined by the isolation insulating layer 110 in the substrate 101, and may be disposed to extend in the first direction (e.g., the X direction). A plurality of the active fins 105 may be spaced apart from each other in the second direction (e.g., the Y direction). The active fin 105 may have a structure protruding from the substrate 101 and into, or partially through, the isolation insulating layer 110. The active fin 105 may be formed as a portion of the substrate 101 or may include an epitaxial layer grown from the substrate 101. However, the active fin 105 on the substrate 101 may be partially recessed on both sides of the gate structure 160 (e.g., in between adjacent gate structures 160), and the source/drain region 150 may be disposed on the recessed active fin 105. Accordingly, as illustrated in FIG. 2A, the active fin 105 below the channel layers 140 and the gate pattern 165 may have an upper surface 105U disposed at a level relatively higher than a level of the lower surface of the source/drain region 150.

In example embodiments, the active fins 105 may include impurities, and at least a portion of the active fins 105 may include impurities of different conductivity types, but an example embodiment thereof is not limited thereto. In an example embodiment, the active fin 105 may have regions having different widths in the Y direction, and accordingly, transistors having different channel widths may be provided, but an example embodiment thereof is not limited thereto. A spacing or pitch between the active fins 105 may be varied in example embodiments.

The isolation insulating layer 110 may define the active fins 105 in the substrate 101. The isolation insulating layer 110 may be formed by, for example, a shallow trench isolation (STI) process. The isolation insulating layer 110 may be disposed between side surfaces of active fins 105 that face each other. The isolation insulating layer 110 may cover at least a portion of opposing side surfaces of the active fins 105. For example, the isolation insulating layer 110 may cover lower side surfaces of the active fin 105 and may partially expose the upper side surfaces of the active fin 105. The isolation insulating layer 110 may be disposed between the active fins 105 and may extend in the X direction as shown, e.g., in FIGS. 1 and 2A. The isolation insulating layer 110 may be formed of an insulating material.

The isolation insulating layer 110 may include a liner oxide region 110L_o and a gap-fill insulating region 110s, as indicated by a dotted line in FIGS. 2A to 2C. The liner oxide region 110L_o may be formed along the side surface and the bottom surface of the isolation insulating layer 110 between the active fins 105. The liner oxide region 110L_o may be formed by oxidizing a liner layer (see 'LL' in FIGS. 10A and 10B) including silicon (Si) in a subsequent process. The gap-fill insulating region 110s may be configured to fill a space in the isolation insulating layer 110 other than the liner oxide region 110L_o. The liner oxide region 110L_o and the gap-fill insulating region 110s may include the same insulating material, such as, for example, silicon oxide, and a boundary therebetween may be indistinct, but the boundary may be distinct depending on process conditions. A boundary between the active fins 105 or the substrate 101 and the liner oxide region 110L_o may be distinct.

The level Ls of the upper surface 110U of the isolation insulating layer 110 may be higher than the level Lf of the upper surface 105U of the active fin 105. The upper surface 110U of the isolation insulating layer 110 disposed at the level Ls may be in contact with the lower surface 164L of the spacer layer 164 extending downwardly along the side surface of the gate pattern 165. In example embodiments, the "levels" of different surfaces may be defined and compared to each other with respect to the upper surface of the substrate 101. The isolation insulating layer 110 may be spaced apart from upper side surfaces of the active fins 105 below the gate pattern 165, and may be in contact with the upper side surfaces of the active fins 105 outside the gate pattern 165. The isolation insulating layer 110 may be partially recessed by the gate pattern 165, and the level Lg of the lower surface 165L of the gate pattern 165 may be lower than the level Ls of the upper surface 110U of the isolation insulating layer 110. The upper surface of the isolation insulating layer 110 recessed by the gate pattern 165 and disposed at the level Lg may be referred to as a "recessed upper surface."

The isolation insulating layer 110 may include raised regions Ra and Rb disposed at a level higher than a level of the lower surface 165L of the gate pattern 165. The raised regions Ra and Rb may be defined as one region of the isolation insulating layer 110, and may refer to a region protruding in the Z direction from a portion of the isolation insulating layer 110 with respect to the level Lg of the lower surface 165L of the gate pattern 165. The raised regions Ra and Rb may have a level higher than the level Lg of the lower surface 165L of the gate pattern 165 or the level Lf of the upper surface 105U of the active fin 105 in an upper portion of the region of the isolation insulating layer 110 that is between the adjacent active fins 105 and on an external side of the gate pattern 165. The level Ls of the upper surface 110U of the raised regions Ra and Rb of the isolation insulating layer 110 may be higher than the level Lf of the upper surface of the active fin 105. The raised regions Ra and Rb of the isolation insulating layer 110 may cover side surfaces of the lower region including the lower surface 165L of the gate pattern 165.

Figure 20A:
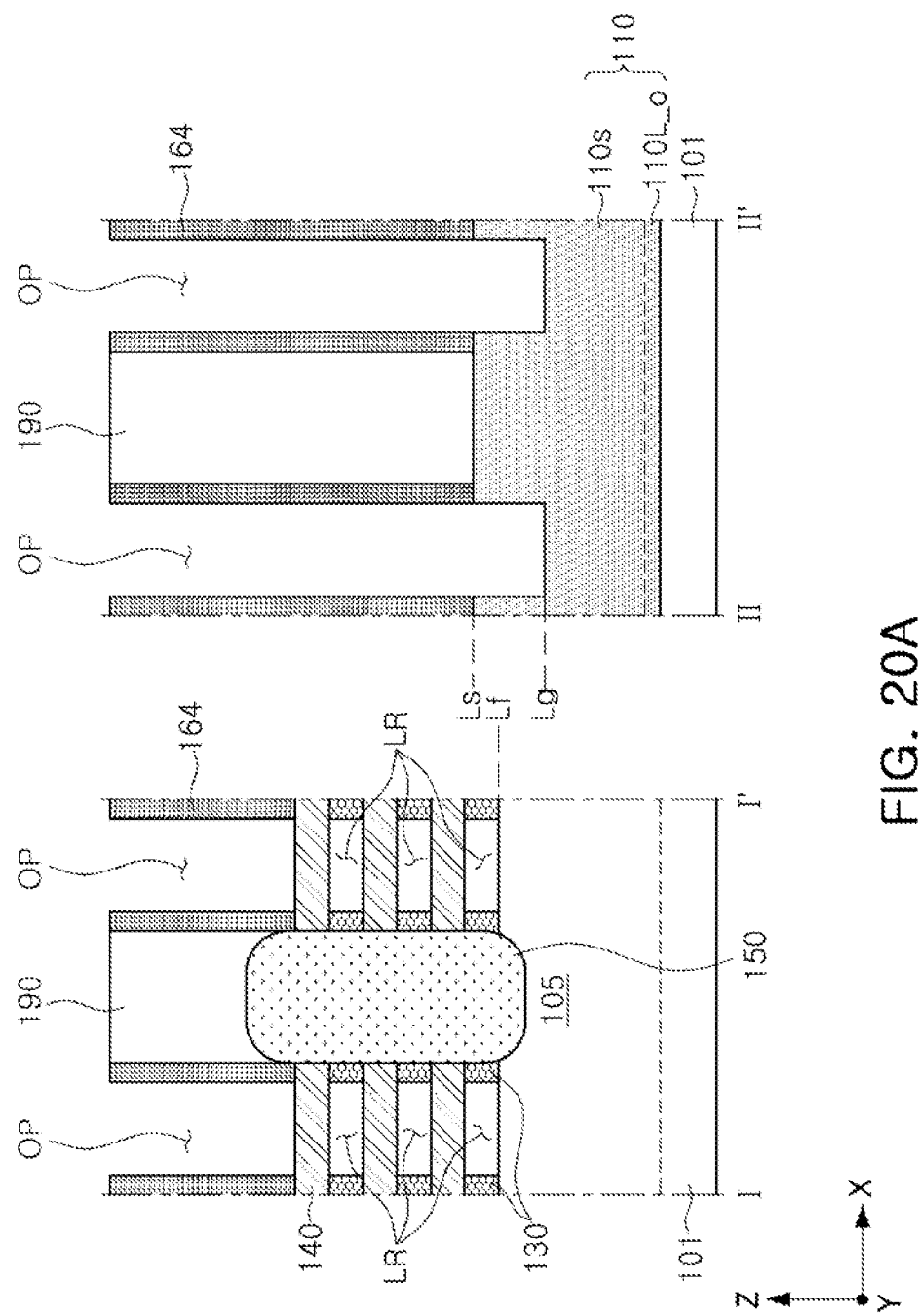
Figure 20B:
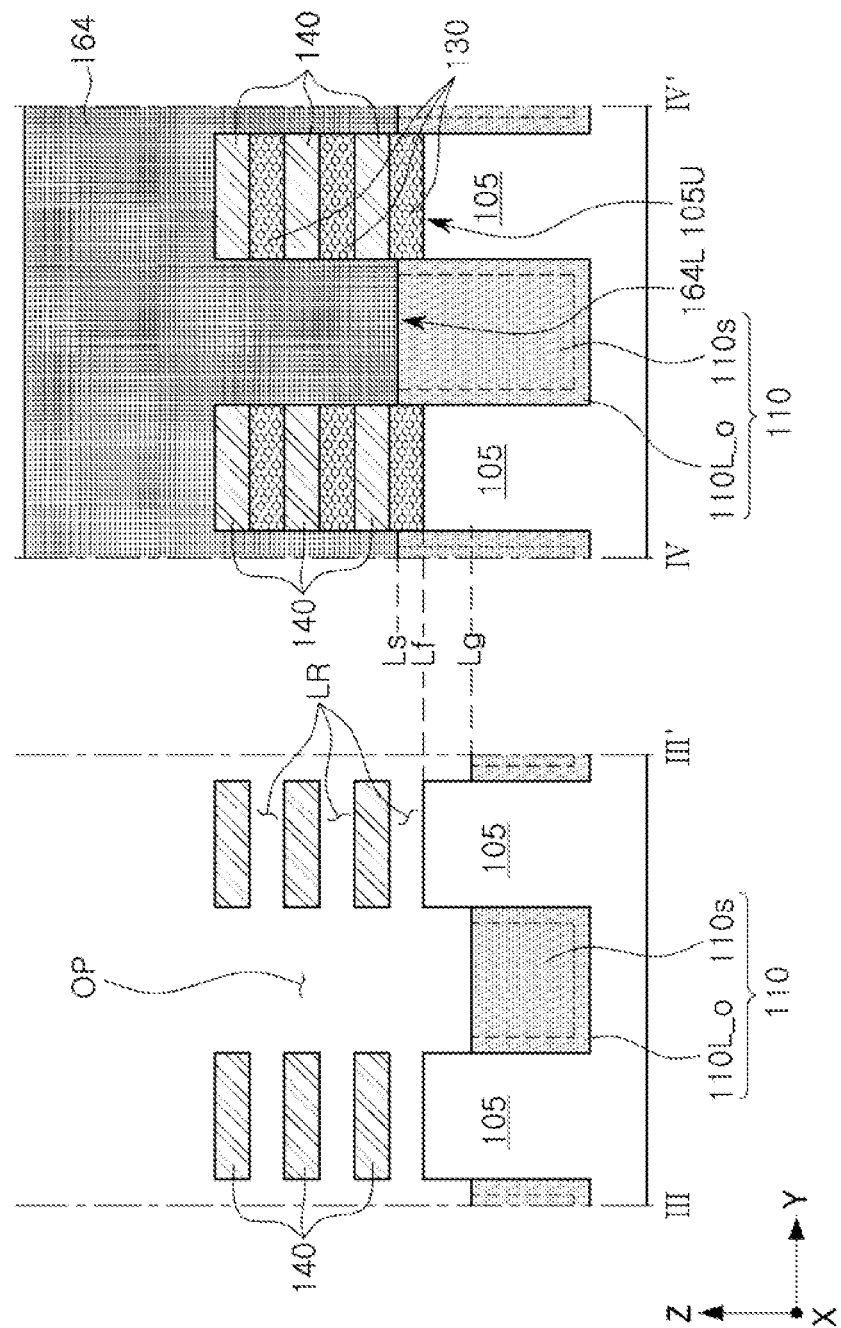
Figure 21:
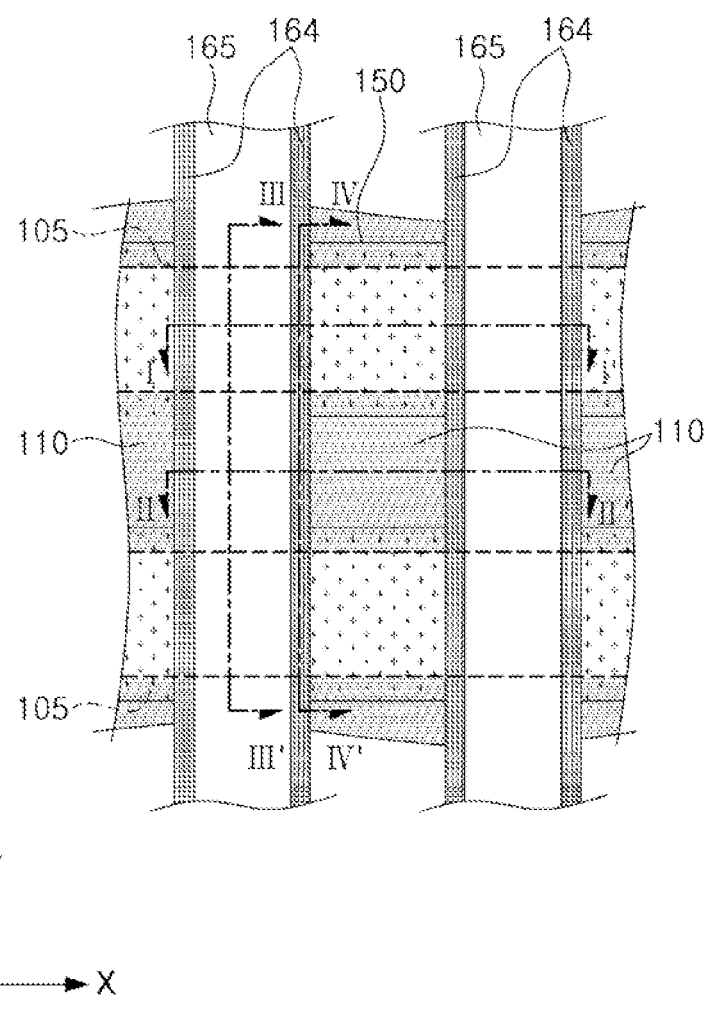
Figure 22A:
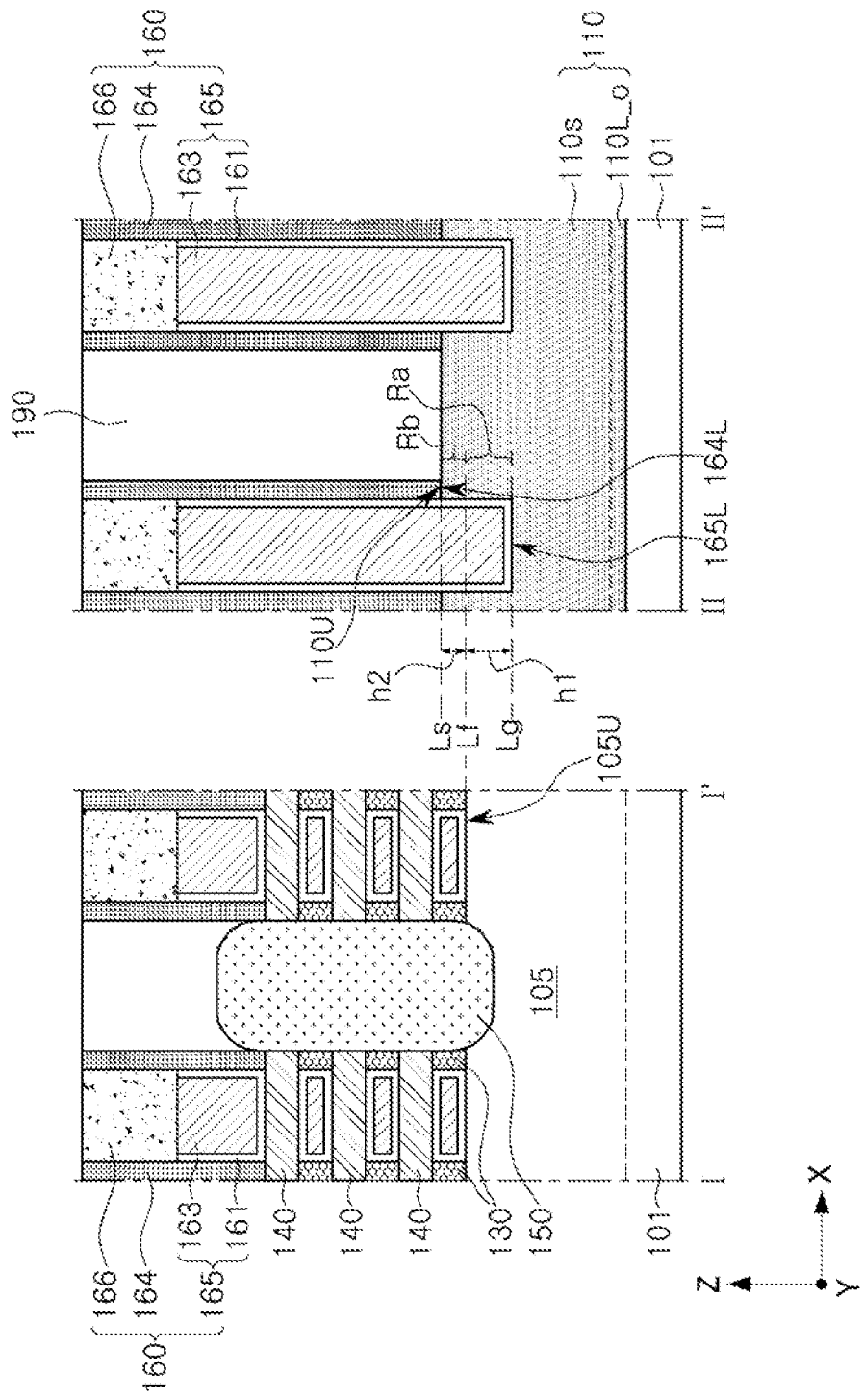
Figure 22B:
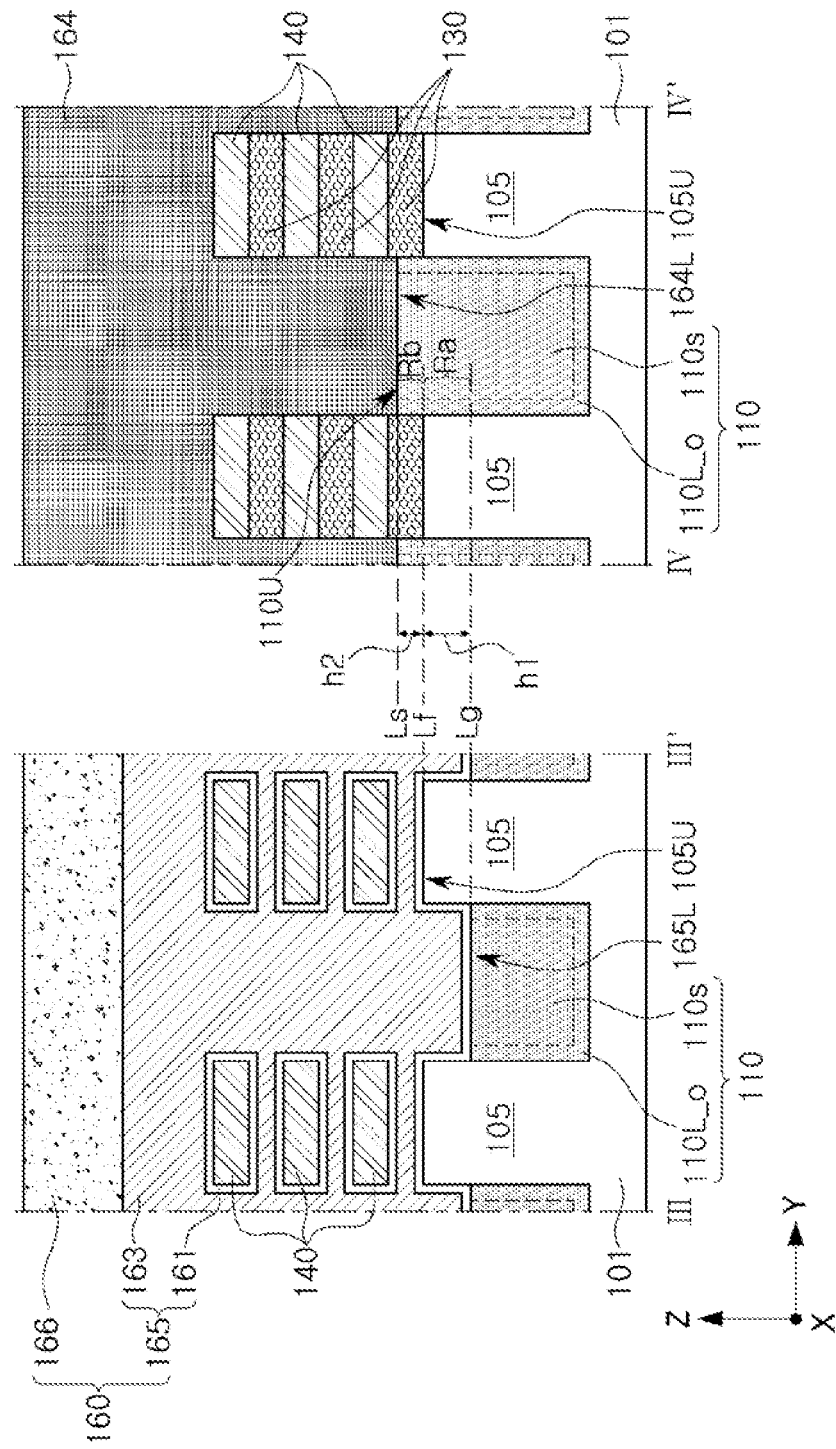

The raised regions Ra and Rb of the isolation insulating layer 110 may include a first region Ra disposed at a level higher than the level Lg of the lower surface 165L of the gate pattern 165 but lower than the level Lf of the upper surface 105U of the active fin 105, and a second region Rb disposed at a level higher than the level Lf of the upper surface 105U of the active fin 105. The first region Ra may cover upper side surfaces of the active fin 105. The second region Rb may cover at least a portion of side surfaces of the inner spacer layers 130, and a portion of the upper surface 110U of the second region Rb may be in contact with the lower surface 164L of the spacer layer 164 at a higher level than the upper surface 105U of the active fin 105. During the manufacturing process of the semiconductor device, since the isolation insulating layer 110 is also formed in a raised form on the region in which the gate pattern 165 is formed (see FIG. 13B), a recessed upper surface (disposed at the level "Lg" in FIG. 20b) of the isolation insulating layer 110 may be configured to be disposed on a relatively higher level than in the example in which the isolation insulating layer 110 is not raised. Accordingly, the area or volume of the region in which the gate pattern 165 is formed to extend further downwardly than the level Lf of the upper surface 105U of the active fin 105 may be reduced. Accordingly, resistance of the gate electrode 163 of the gate pattern 165 may be reduced, such that electrical properties of the semiconductor device may improve.

In an example, a level difference h1 between the upper surface 105U of the active fin 105 and the lower surface 165L of the gate pattern 165 (e.g., the difference between Lf and Lg) may be greater than about 0 nm and equal to or less than about 10 nm. The h1 value may be a relatively small value as compared to the example in which the upper surface 110U of the isolation insulating layer 110 is formed at the same level as or a level lower than a level of the upper surface 105U of the active fin 105.

In an example, the level difference h1 between the upper surface 105U of the active fin 105 and the lower surface 165L of the gate pattern 165 may be greater than about 0 nm and equal to or less than about 5 nm. The h1 value may be a relatively small value as compared to the example in which the upper surface 110U of the isolation insulating layer 110 is formed at the same level as or a level lower than the level of the upper surface 105U of the active fin 105.

In an example, a level difference h2 between the upper surface 105U of the active fin 105 and the upper surface 110U of the raised regions Ra and Rb of the isolation insulating layer 110 (e.g., the difference between Ls and Lf) may be greater than about 0 nm and equal to or less than 10 nm.

In an example, in the isolation insulating layer 110, a vertical depth Vd (see, e.g., FIG. 2A) between a lower end and an upper end may be about 25 nm or less. The vertical depth Vd may be about 15 nm or less or about 10 nm or less.

The channel layers 140 may include two or more layers spaced apart from each other in a direction (e.g., the Z direction) perpendicular to the upper surface 105U of the active fin 105. The plurality of channel layers may include three layers in the drawing, but an example embodiment thereof is not limited thereto, and the plurality of layers may include four layers, for example. The channel layers 140 may be disposed on the active fins 105 in regions in which the active fins 105 intersect the gate structures 160. For example, a plurality of first channel layers may be disposed on a first active fin and a plurality of second channel layers may be disposed on a second active fin. The channel layers 140 may be connected to the source/drain region 150 and may be spaced apart from the upper surface 105U of the active fin 105. The channel layers 140 may have the same width as or a similar width to that of the active fin 105 in the Y direction, and may have the same width as or a similar width to that of the gate structure 160 in the X direction. However, in example embodiments, the channel layers 140 may have a width in the X direction smaller than a width of the gate structure 160 in the X direction.

The channel layers 140 may be formed of a semiconductor material, and may include, for example, at least one of silicon (Si), silicon-germanium (SiGe), and germanium (Ge). The channel layers 140 may be formed of the same material as that of the substrate 101, for example. In example embodiments, the channel layers 140 may include an impurity region disposed in a region adjacent to the source/drain regions 150.

The inner spacer layers 130 may be disposed side by side with the gate pattern 165 between the channel layers 140. The inner spacer layers 130 may have an external side surface substantially coplanar with an external side surface of each of the channel layers 140. The gate pattern 165 may be spaced apart from the source/drain regions 150 by the inner spacer layers 130 in a region below and between the channel layers 140. The inner spacer layers 130 may have a shape in which a side surface thereof opposing the gate pattern 165 is rounded inwardly toward the gate pattern 165, but an example embodiment thereof is not limited thereto. The inner spacer layers 130 may be formed of any one or more of oxide, nitride, and oxynitride, and may be formed of a low-k film, for example.

The source/drain regions 150 may be disposed on the active fin 105 on both sides of the channel layers 140. The source/drain regions 150 may work as a source region or a drain region of a transistor. The source/drain region 150 may be disposed to cover the active fin 105 on a side surface of each of the channel layers 140 and on a lower end of the source/drain region 150. The source/drain region 150 may be partially recessed into the upper portion of the active fin 105, but in example embodiments, the presence or absence of the recess and the depth of the recess may be varied. In an example embodiment, the source/drain region 150 may have a merged shape connected to each other between the active fins 105 adjacent in the Y direction, but an example embodiment thereof is not limited thereto.

The source/drain regions 150 may be configured as a semiconductor layer including silicon (Si), and may be formed of an epitaxial layer. The source/drain regions 150 may include impurities of different types and/or concentrations. For example, the source/drain regions 150 may include n-type doped silicon (Si) or p-type doped silicon germanium (SiGe). In example embodiments, the source/drain regions 150 may include a plurality of regions including elements and/or doping elements of different concentrations.

The gate structure 160 may intersect the active fin 105 and the channel layers 140 on the active fin 105 and the channel layers 140 and may extend in the second direction (e.g., the Y direction). The active fin 105 and the channel layers 140 may together form a channel region of a transistor across the gate structure 160. The gate structure 160 may include a gate pattern 165, spacer layers 164 on both sides of the gate pattern 165, and a gate capping layer 166 on an upper surface of the gate pattern 165.

The gate pattern 165 may include a gate electrode 163 and a gate dielectric layer 161. The gate pattern 165 may have a lower surface 165L in contact with the isolation insulating layer 110 on an external side of the active fins 105, and the level Lg of the lower surface 165L of the gate pattern 165 may be disposed at a level lower than the level Lf of the upper surface 105U of the active fins 105. The level Lg of the lower surface 165L of the gate pattern 165 may be disposed at a level lower than the level Ls of the lower surface 164L of the spacer layer 164. In example embodiments, the level Lg of the lower surface 165L of the gate pattern 165 may be substantially the same as the level Lf of the upper surface 105U of the active fins 105.

The gate dielectric layer 161 may be disposed between the gate electrode 163 and the active fin 105 and between the gate electrode 163 and the channel layers 140, and may surround overall surfaces of the gate electrode 163 other than an uppermost surface of the gate electrode 163. The gate dielectric layer 161 may be disposed between the gate electrode 163 and the isolation insulating layer 110. The gate dielectric layer 161 may extend to a region between the gate electrode 163 and the spacer layers 164, but an example embodiment thereof is not limited thereto. The gate dielectric layer 161 may extend further downwardly than the lower surface 164L of the spacer layer 164 and may be in contact with the isolation insulating layer 110 including the raised regions Ra and Rb (see, e.g., FIG. 2A). The gate dielectric layer 161 may be surrounded by the isolation insulating layer 110 and the active fin 105 below the level Ls of the lower surface 164L of the spacer layer 164, and the isolation insulating layer 110 may be in contact with side surfaces and lower surfaces of the gate dielectric layer 161 below the level Ls, for example.

The gate dielectric layer 161 may include any one or more of an oxide, nitride, or high-k material. The high-k material may refer to a dielectric material having a dielectric constant higher than that of a silicon oxide layer ($SiO_2$). The high-k material may be any one or more of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$), for example.

The gate electrode 163 may fill a region between the channel layers 140 above the active fin 105, and may extend to the upper surface of the channel layers 140. The gate electrode 163 may be spaced apart from the channel layers 140 by the gate dielectric layer 161. The gate electrode 163 may include a conductive material, such as, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. The gate electrode 163 may include multilayers, two or more layers. Depending on the configuration of the semiconductor device 100, the gate electrode 163 may be disposed to be isolated between at least a portion of adjacent transistors by an isolation portion.

The spacer layers 164 may be disposed on both side surfaces of the gate electrode 163 and may extend in the Z direction perpendicular to the upper surface of the substrate 101. The spacer layers 164 may intersect the active fins 105 and may extend in the Y direction. The spacer layer 164 may extend downwardly along side surfaces of the channel layers 140 and the lower surface 164L of the spacer layer 164 may be in contact with a portion of the isolation insulating layer 110 including the raised regions Ra and Rb. The lower surface 164L of the spacer layer 164 in contact with the isolation insulating layer 110 may be disposed on a region between adjacent active fins 105. The level Ls of the lower surface 164L of the spacer layer 164 may be higher than the level Lf of the upper surface 105U of at least one of the active fins 105. In an example embodiment, the spacer layers 164 may include a portion of which an external side surface may be curved such that a width of the upper portion may be smaller than a width of the lower portion. The spacer layers 164 may insulate the source/drain regions 150 and the gate electrodes 163. The spacer layers 164 may have a multilayer structure in example embodiments. The spacer layers 164 may be formed of any one or more of oxide, nitride, or oxynitride, and may be formed of a low-k film, for example.

The gate capping layer 166 may be disposed on the gate electrode 163. The gate capping layer 166 may extend in the second direction (e.g., the Y direction), along the upper surface of the gate electrode 163. The side surfaces of the gate capping layer 166 may be surrounded by the spacer layers 164. The gate capping layer 166 may be formed of oxide, nitride, and oxynitride, and may include at least one of SiO, SiN, SiCN, SiOC, SiON, and SiOCN, for example.

The contact structure 180 may penetrate the interlayer insulating layer 190 in a vertical direction (e.g., the Z direction) between the gate structures 160. The contact structure 180 may be connected to the source/drain regions 150. The contact structure 180 may apply an electrical signal to the source/drain regions 150. The contact structure 180 may be disposed on the source/drain regions 150. The contact structure 180 may have an inclined side surface of which a width of the lower portion is narrower than a width of the upper portion depending on an aspect ratio, but an example embodiment thereof is not limited thereto. The contact structure 180 may include a metal-semiconductor compound layer 181 and a contact plug 185 on the metal-semiconductor compound layer 181.

The metal-semiconductor compound layer 181 may include, for example, metal silicide, metal germanide, or metal silicide-germanide. In the metal-semiconductor compound layer 181, the metal may be any one or more of titanium (Ti), nickel (Ni), tantalum (Ta), cobalt (Co), and tungsten (W), and the semiconductor may be any one or more of silicon (Si), germanium (Ge), and silicon germanium (SiGe). For example, the metal-semiconductor compound layer 181 may include at least one of cobalt silicide (CoSi), titanium silicide (TiSi), nickel silicide (NiSi), and tungsten silicide (WSi).

The contact plug 185 may include a barrier layer 185A and a plug layer 185B. The barrier layer 185A may surround a lower surface and side surfaces of the plug layer 185B. The barrier layer 185A may include a metal nitride, such as, for example, at least one of titanium nitride (TiN), tantalum nitride (TaN), and tungsten nitride (WN). The plug layer 185B may include a metal material, such as, for example, at least one of aluminum (Al), copper (Cu), tungsten (W), cobalt (Co), ruthenium (Ru), or molybdenum (Mo). In an example embodiment, the barrier layer 185A may not be provided.

The interlayer insulating layer 190 may be disposed on the isolation insulating layer 110, the source/drain regions 150, and the gate structures 160. A lower surface of the interlayer insulating layer 190 may be in contact with a portion of the isolation insulating layer 110 not covered by the gate structure 160. The lower surface of the interlayer insulating layer 190 in contact with a portion of the isolation insulating layer 110 may be disposed at the level Ls, and may be disposed at a level higher than the level Lf of the upper surface 105U of the active fin 105. The interlayer insulating layer 190 may include, for example, at least one of an oxide, a nitride, and an oxynitride, and may include a low-k material.

Figure 3A:
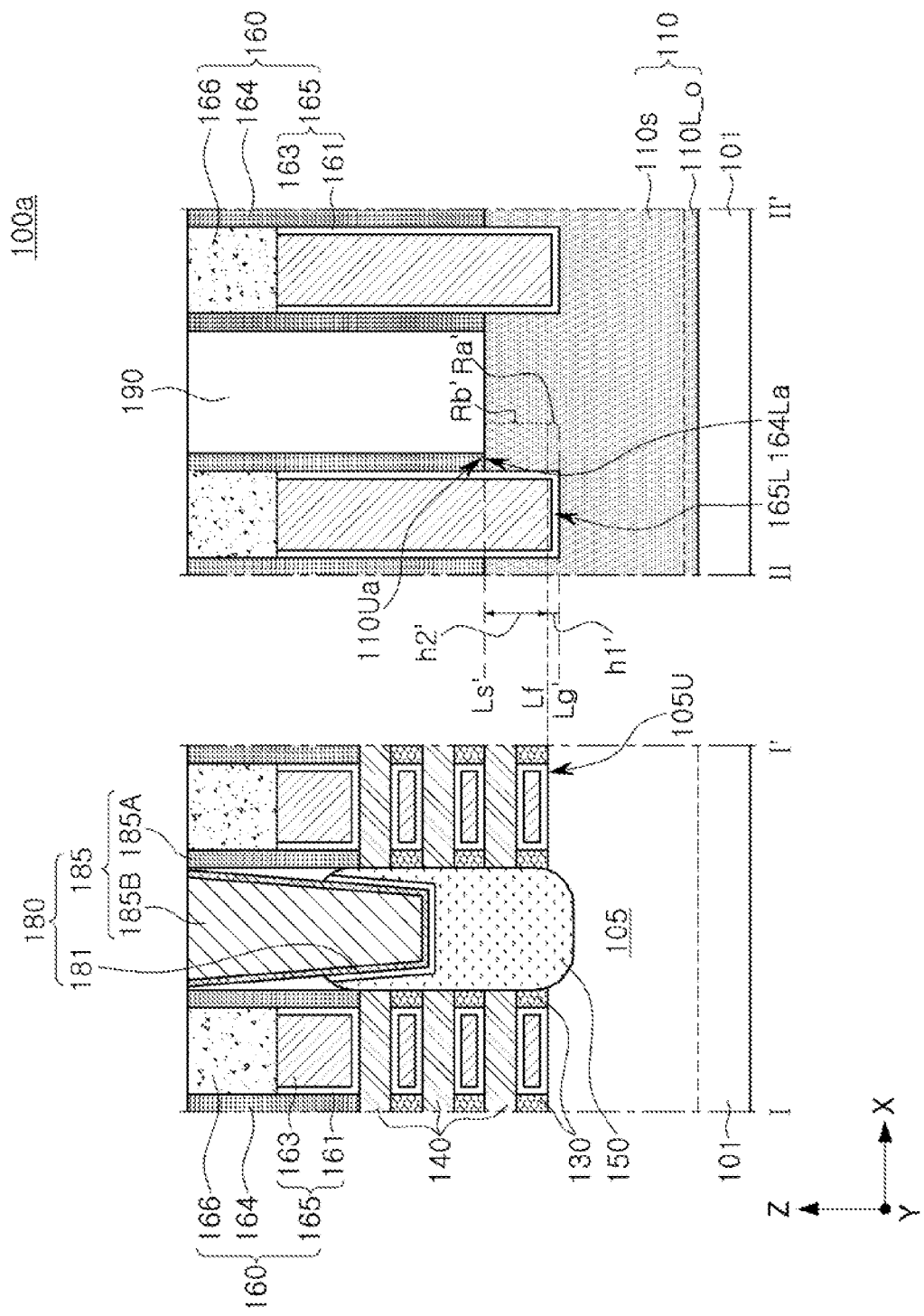
FIGS. 3A, 3B and 3C are cross-sectional views illustrating a semiconductor device according to an example embodiment.
Figure 3B:
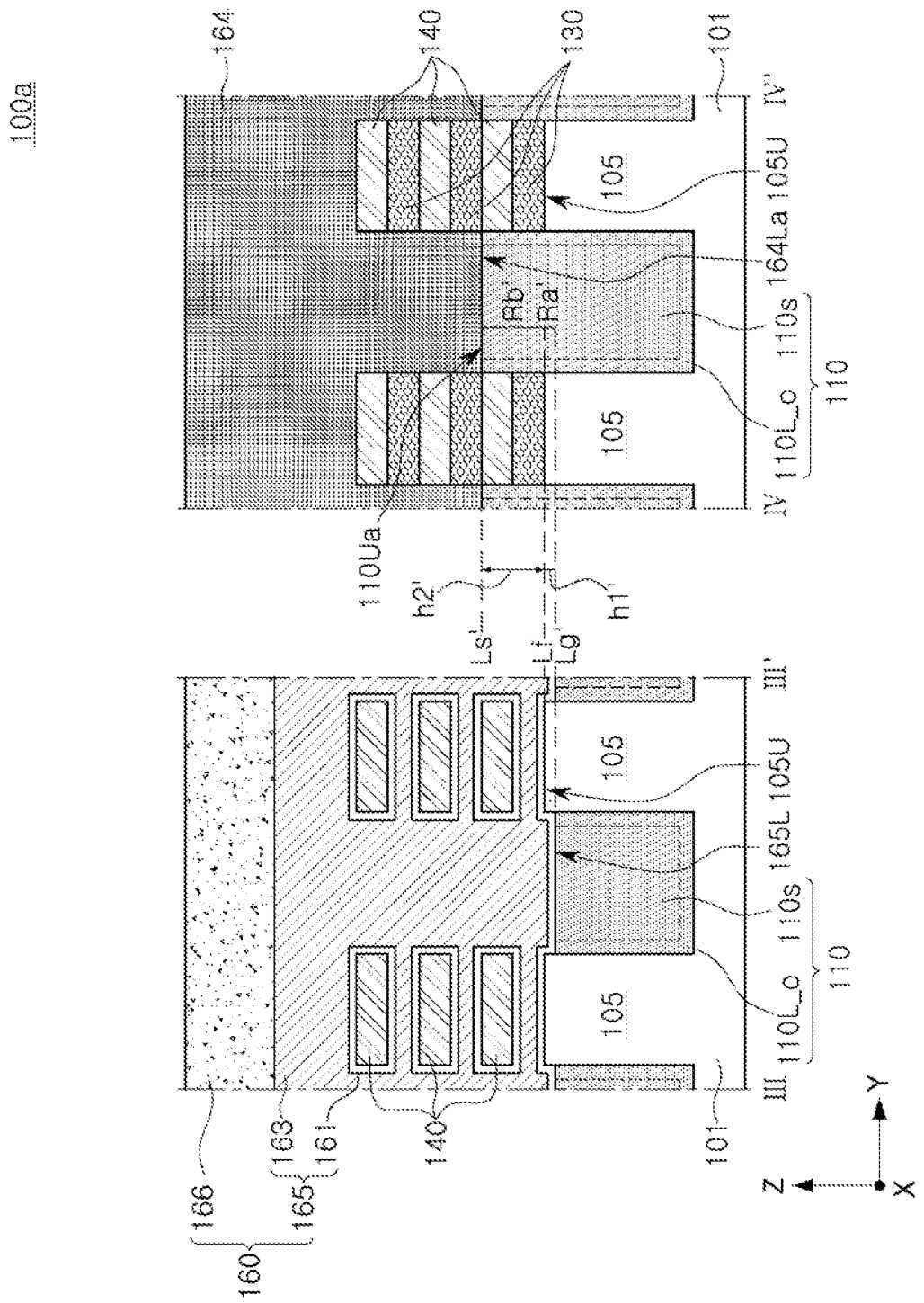
Figure 3C:
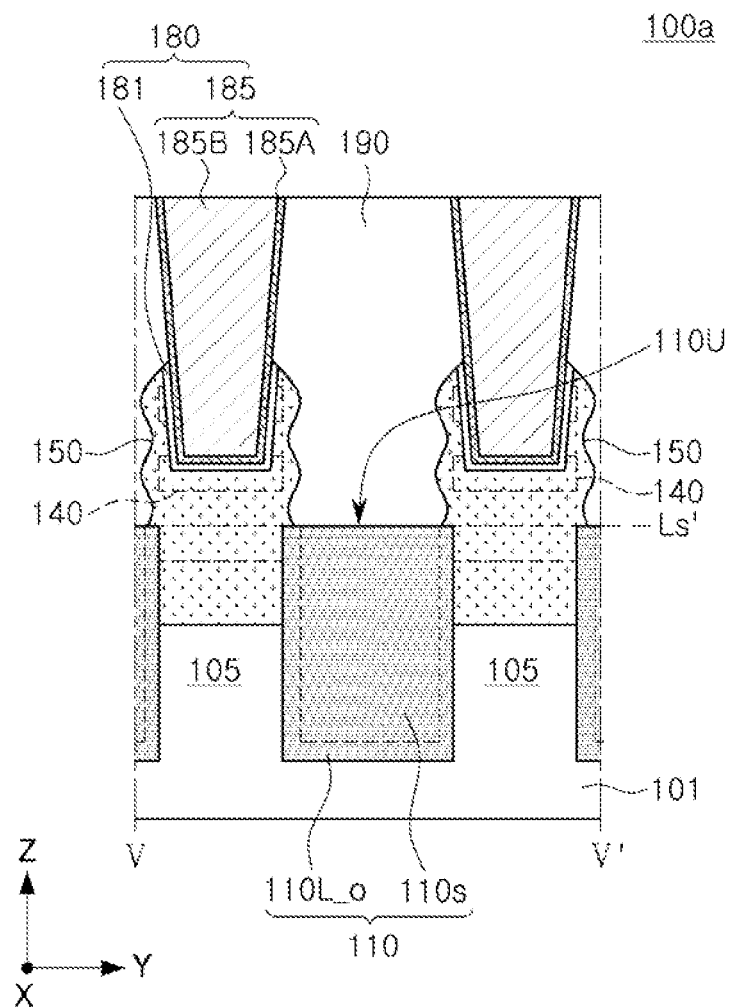

FIGS. 3A to 3C are cross-sectional views illustrating a semiconductor device according to an example embodiment.

Referring to FIGS. 3A to 3C, in a semiconductor device 100a, a level Ls' of an upper surface 110Ua of the isolation insulating layer 110 in contact with a lower surface 164La of the spacer layer 164 may be higher than the level Lf of the upper surface 105U of the active fin 105 and may be higher than a level of the lower surface of a lowermost channel layer 140 among the channel layers 140. By configuring the isolation insulating layer 110 to have a greater vertical thickness, a second region Rb' of raised regions Ra' and Rb' may be disposed at a level higher than in the aforementioned example embodiment. The level Lg' of the lower surface 165L of the gate pattern 165 may be lower than the level Lf of the upper surface 105U of the active fin 105, and may be relatively higher than in the aforementioned example embodiment. The area or volume of a region in which the gate pattern 165 may extend downwardly further than the level Lf of the upper surface 105U of the active fin 105 may be reduced, thereby reducing resistance of the gate electrode 163.

Figure 4A:
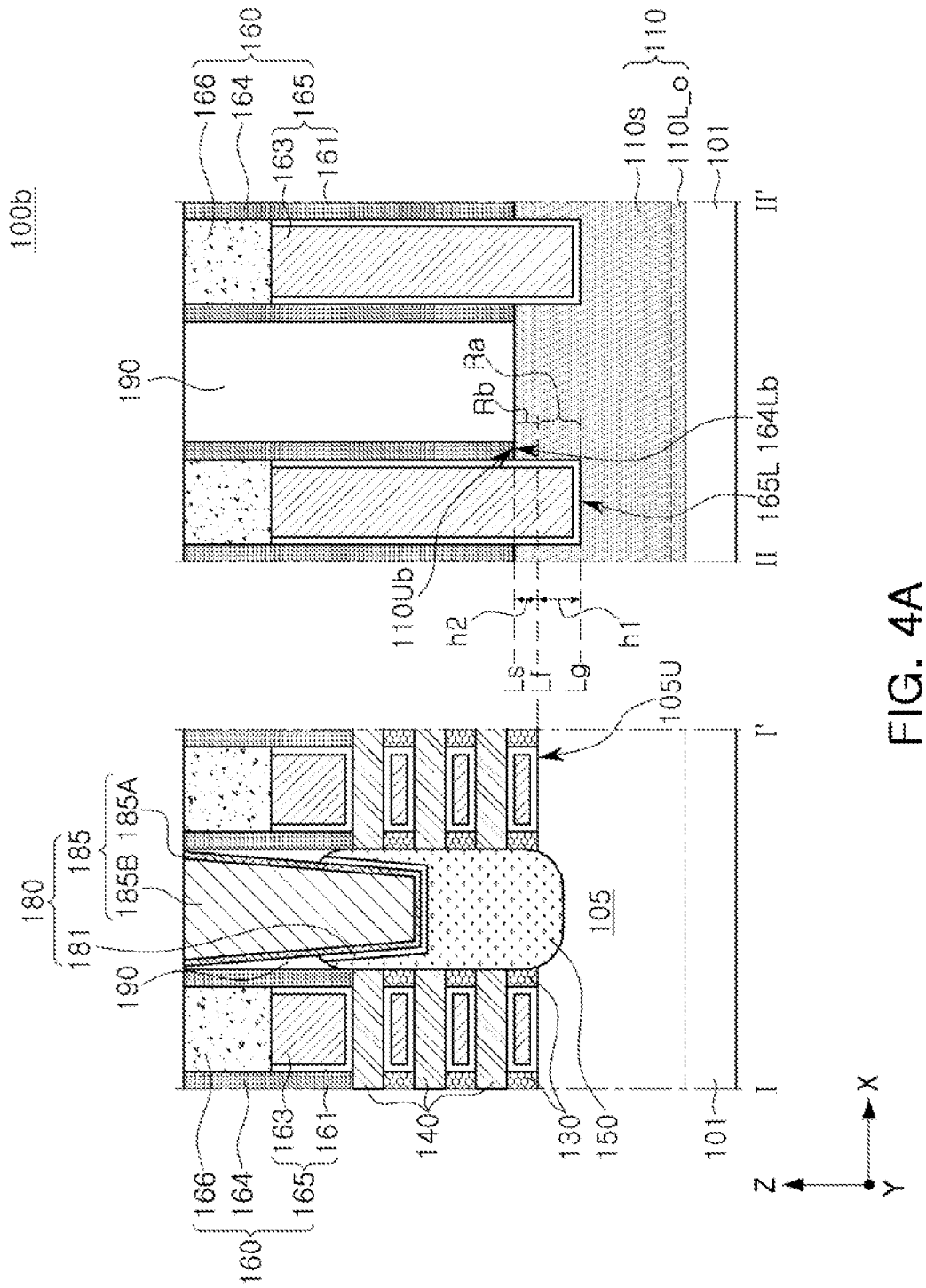
FIGS. 4A, 4B and 4C are cross-sectional views illustrating a semiconductor device according to an example embodiment.
Figure 4B:
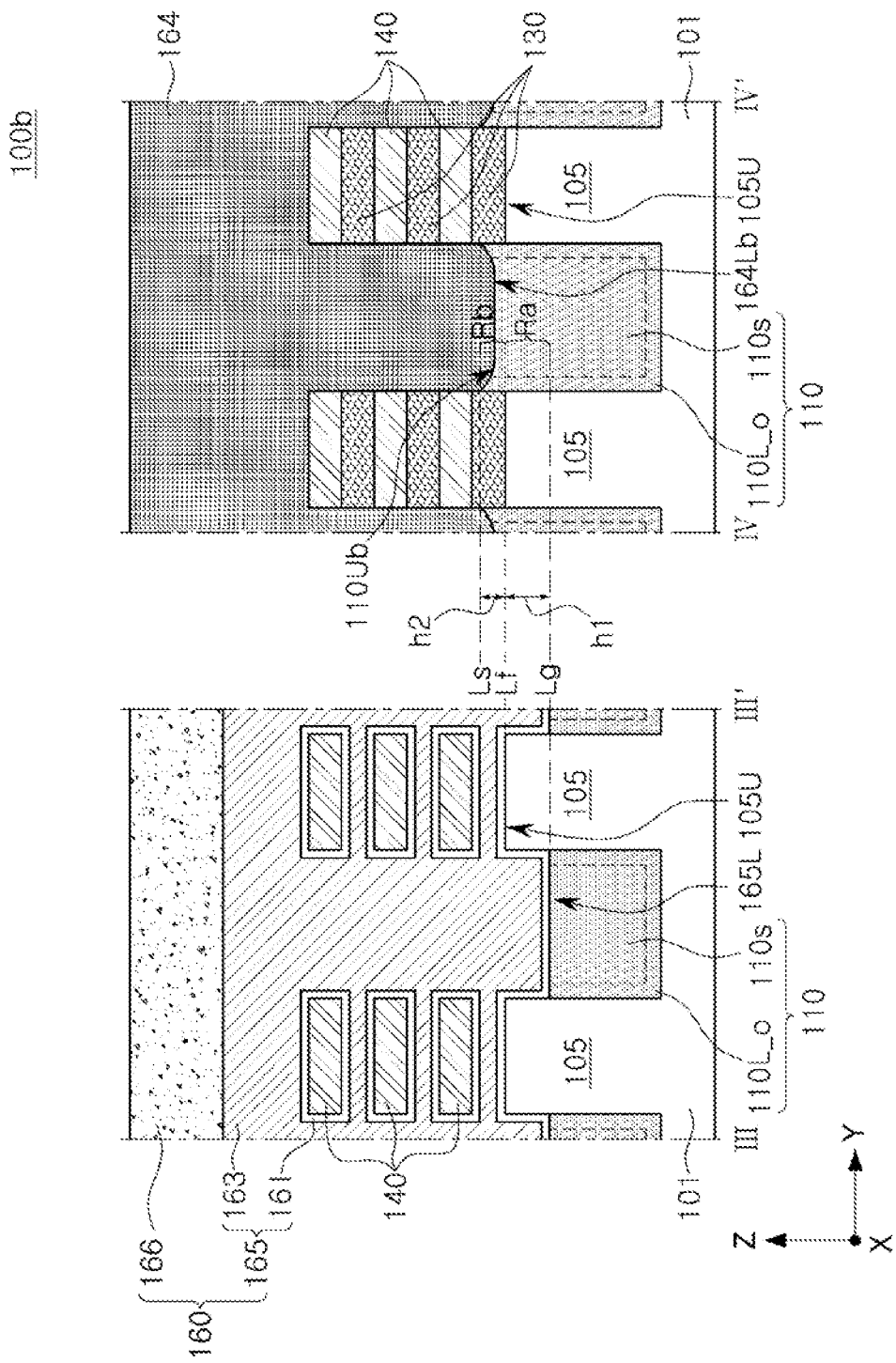
Figure 4C:
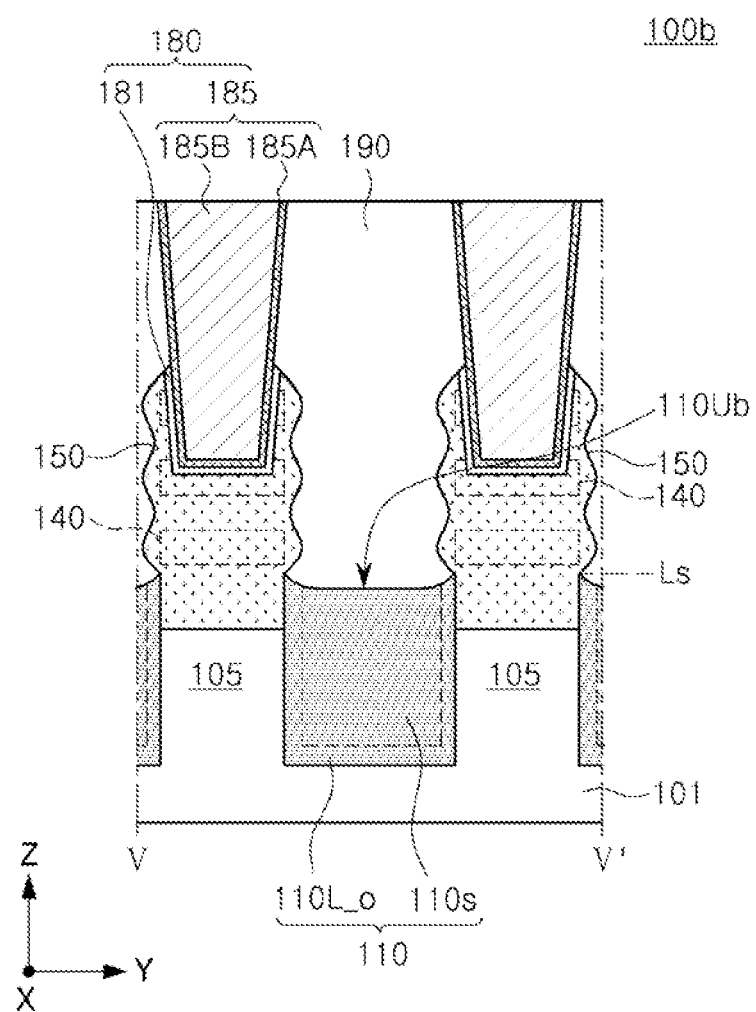

FIGS. 4A to 4C are cross-sectional views illustrating a semiconductor device according to an example embodiment.

Referring to FIGS. 4A to 4C, in a semiconductor device 100b, an upper surface 110Ub of the isolation insulating layer 110 in contact with a lower surface 164Lb of the spacer layer 164 may have a concave portion in a region between the active fins adjacent to each other in the Y direction (see, e.g., FIG. 4B). For example, the raised regions Ra and Rb of the isolation insulating layer 110 may have a higher level towards the active fins 105. For example, the raised regions Ra and Rb of the isolation insulating layer 110 may have an upper surface 110Ub of which the level decreases in a direction away from the active fins 105 from a top portion of the isolation insulating layer 110. The lower surface 164Lb of the spacer layer 164 may also include a convex portion toward the substrate 101 according to the shape of the upper surface 110Ub of the isolation insulating layer 110.

Figure 5:
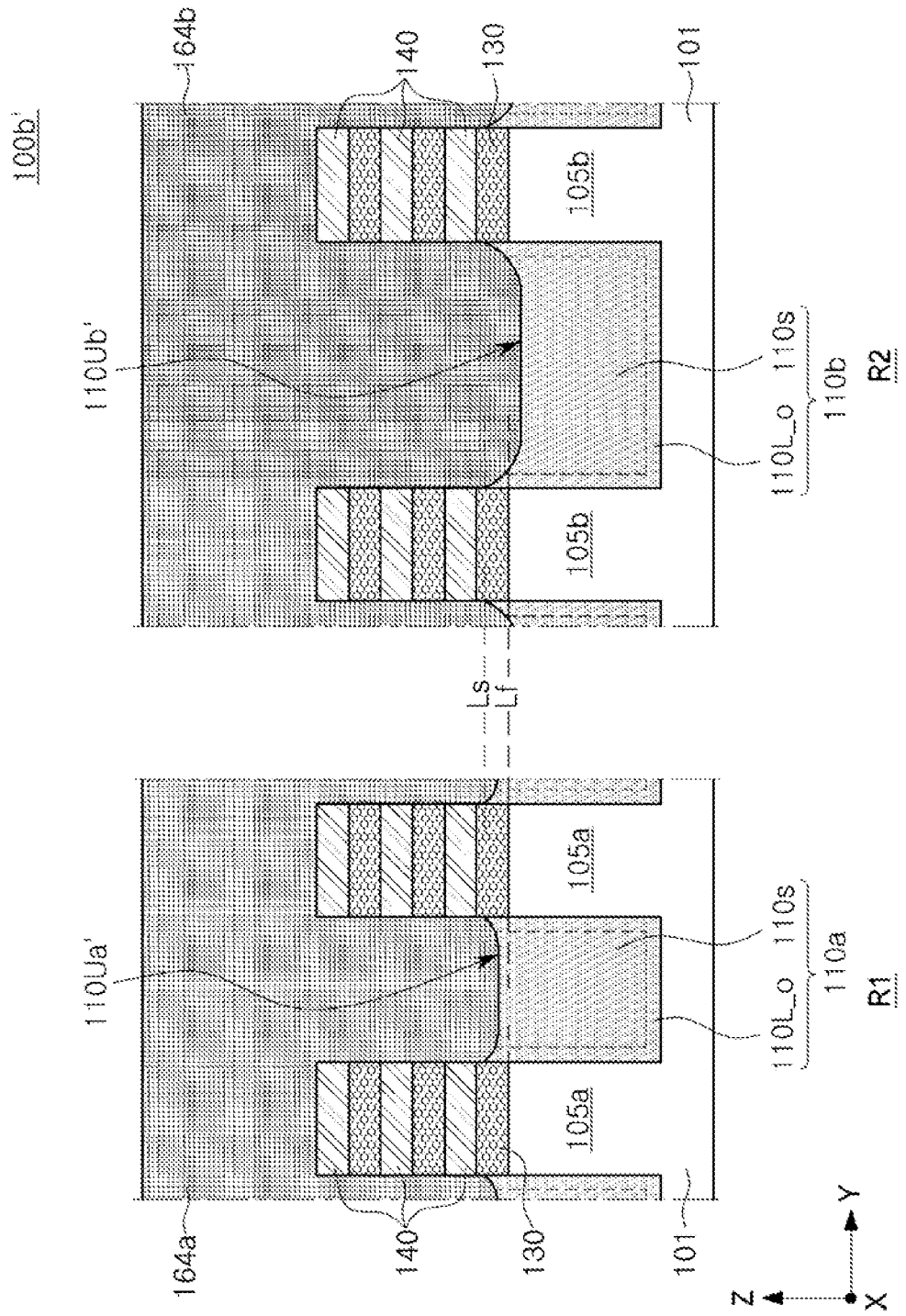
FIG. 5 is a cross-sectional view illustrating a semiconductor device according to an example embodiment.

FIG. 5 is a cross-sectional view illustrating a semiconductor device according to an example embodiment, illustrating a cross-sectional surface of different regions R1 and R2 of the semiconductor device.

Referring to FIG. 5, a distance or pitch between first active fins 105a in the Y direction in a first region R1 of a semiconductor device 100b' may be smaller than a distance or pitch between second active fins 105b in the Y direction in a second region R2. In the second region R2, the isolation insulating layer 110b may have a width greater than that of the isolation insulating layer 110a disposed in the first region R1. By etching loading, an upper surface 110Ub' of the isolation insulating layer 110b between the second active fins 105b in the second region R2 may include a portion having a level lower than the upper surface 110Ua' of the isolation insulating layer 110a between the first active fins 105a in the first region R1. A lowermost point of the upper surface 110Ua' of the isolation insulating layer 110a between the first active fins 105a may be higher than a lowermost point of the upper surface 110Ub' of the isolation insulating layer 110b between the second active fins 105b, but an example embodiment thereof is not limited thereto.

Figure 6A:
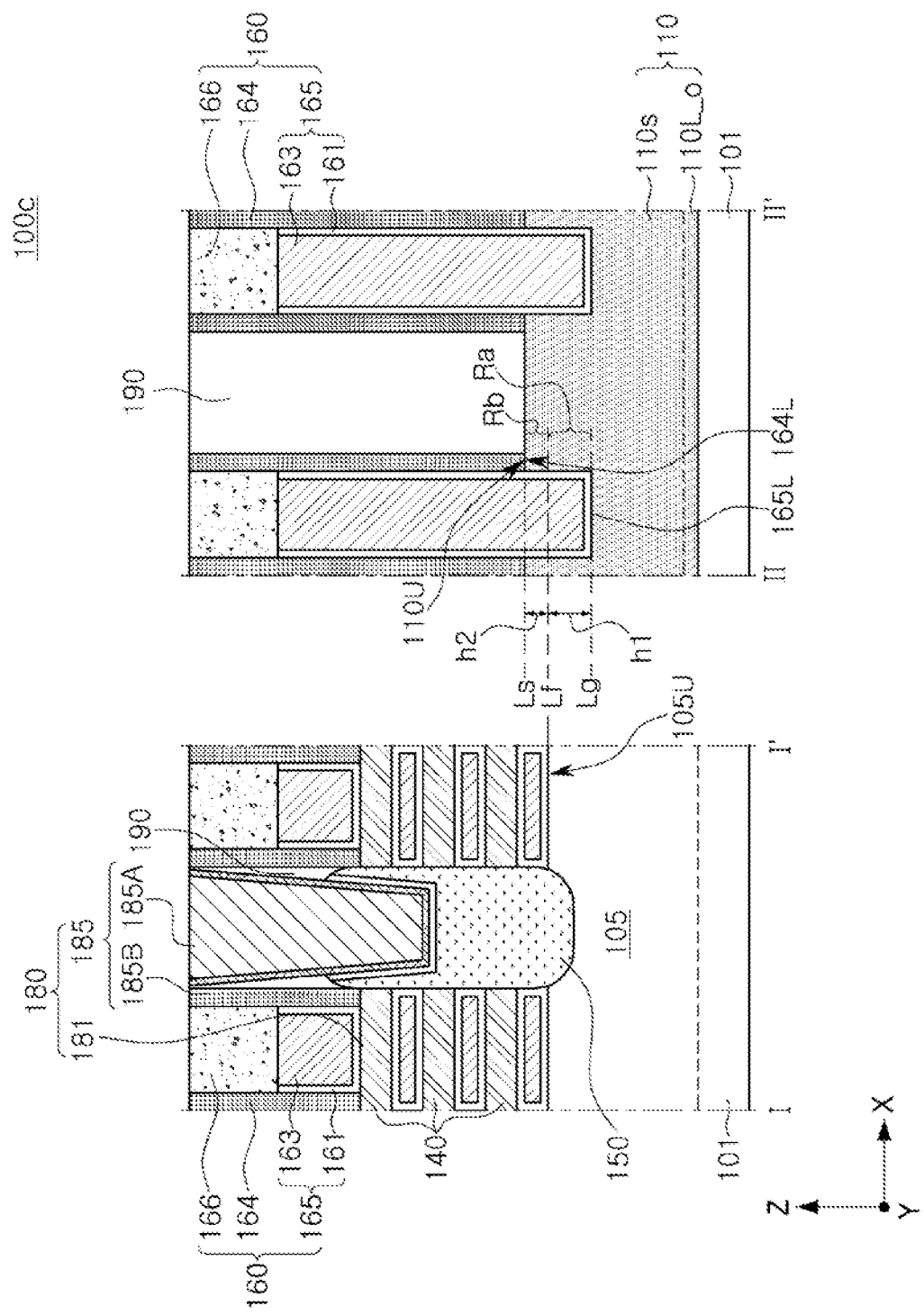
FIGS. 6A and 6B are cross-sectional views illustrating a semiconductor device according to an example embodiment.
Figure 6B:
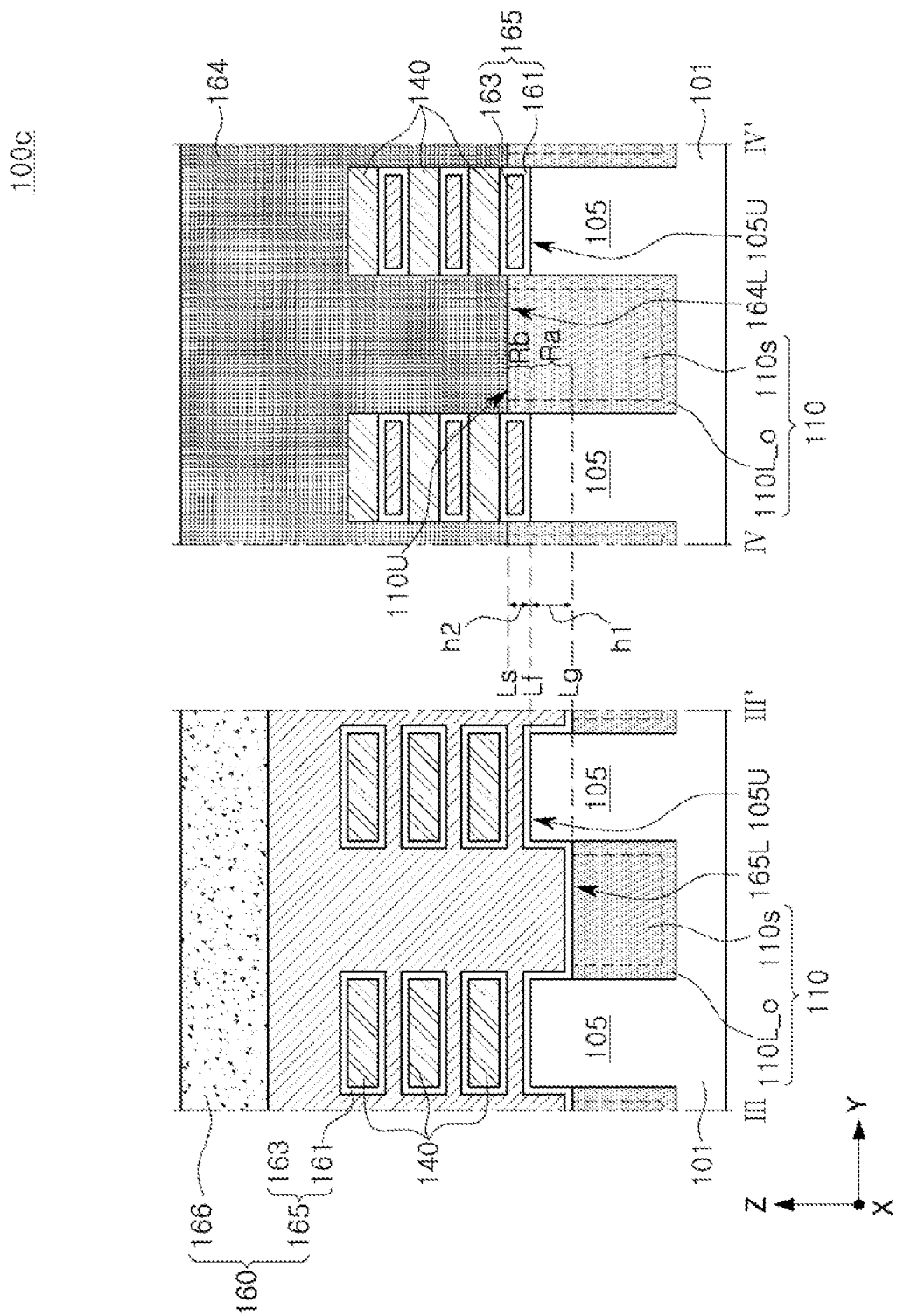

FIGS. 6A and 6B are cross-sectional views illustrating a semiconductor device according to an example embodiment.

Referring to FIGS. 6A and 6B, a semiconductor device 100c may not include the inner spacer layers 130, and accordingly, the gate pattern 165 disposed between the channel layers 140 may have a relatively large width in the X direction and may be in contact with the source/drain regions 150. Referring to FIG. 6B, the raised regions Ra and Rb of the isolation insulating layer 110 may cover upper side surfaces of the active fin 105 and may cover a portion of side surfaces of the gate pattern 165 disposed between the active fin 105 and a lowermost channel layer 140.

Figure 7:
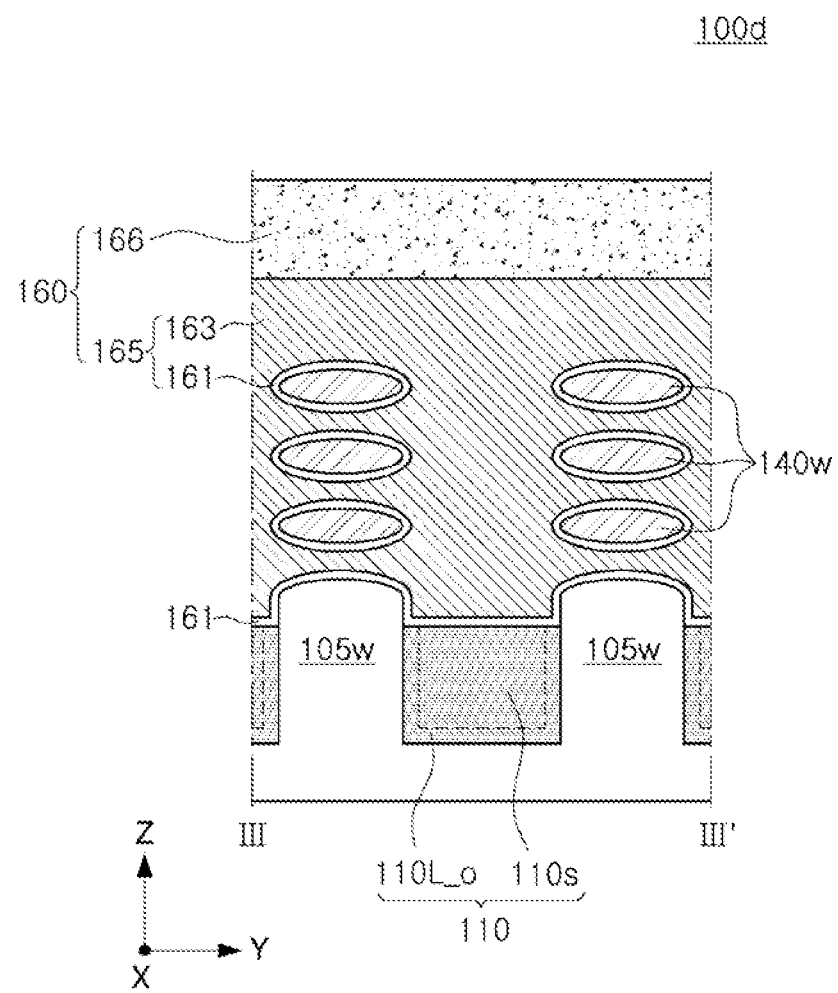
FIG. 7 is a cross-sectional view illustrating a semiconductor device according to an example embodiment.

FIG. 7 is a cross-sectional view illustrating a semiconductor device according to an example embodiment.

Referring to FIG. 7, in a semiconductor device 100d, widths of an active fin 105w and channel layers 140w may be different from widths shown in the example embodiment in FIG. 2B. The active fin 105w and the channel layers 140w may have a relatively small width, such that each channel layer 140w may have a circular shape or an elliptical shape in which there is a difference between the major axis and the minor axis on the cross-sectional surface in the X direction. The isolation insulating layer 110 may include a raised region (refer to Ra and Rb of FIG. 2B), and the level Ls of the lower surface of the spacer layer 164 in contact with the upper surface 110U of the raised regions of the isolation insulating layer 110 may be higher than the level Lf of the upper surface 105wU of the active fin 105w. In example embodiments, widths of the active fin 105w and the channel layers 140w and the shapes according to the widths may be varied.

FIGS. 8 to 22B are views illustrating processes of a method of manufacturing a semiconductor device in order according to an example embodiment. FIGS. 9 to 22B illustrate an example embodiment of a method of manufacturing the semiconductor device in FIGS. 1 to 2C.

Figure 10A:
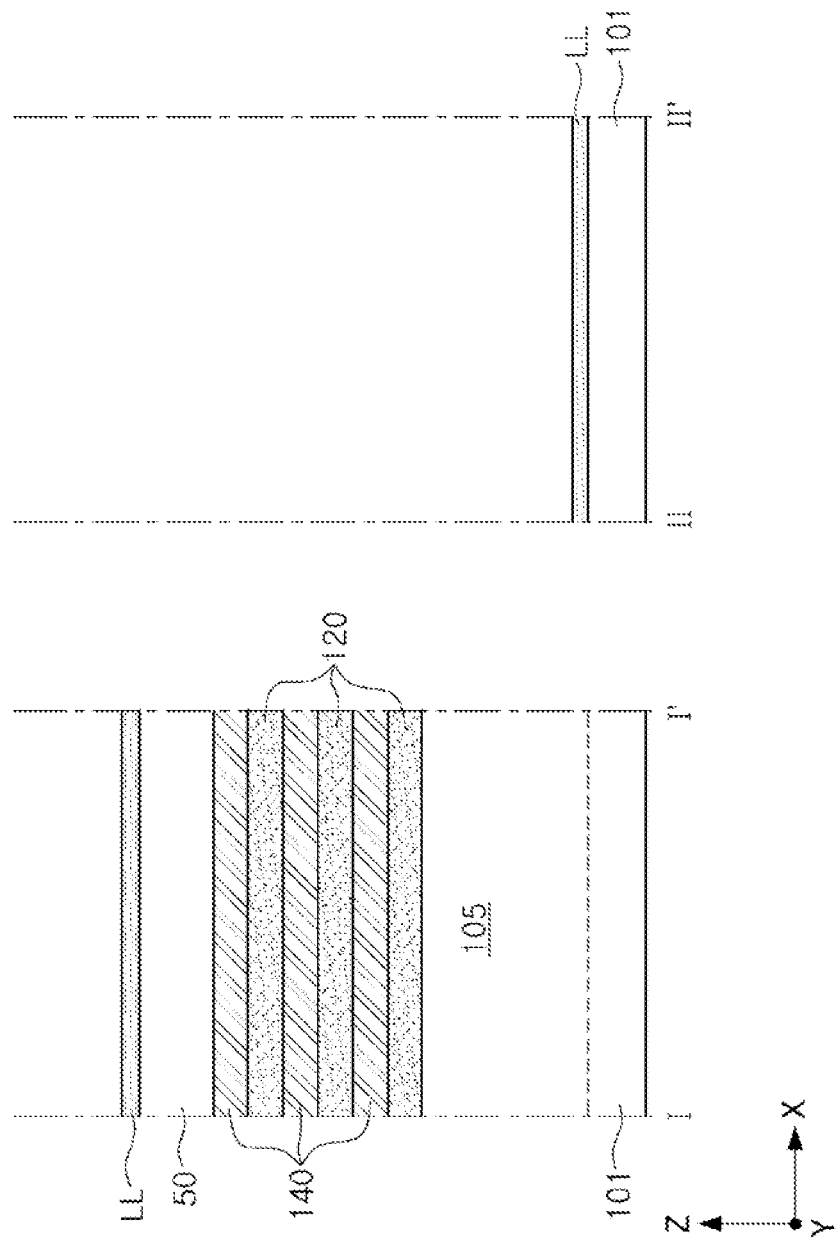
Figure 10B:
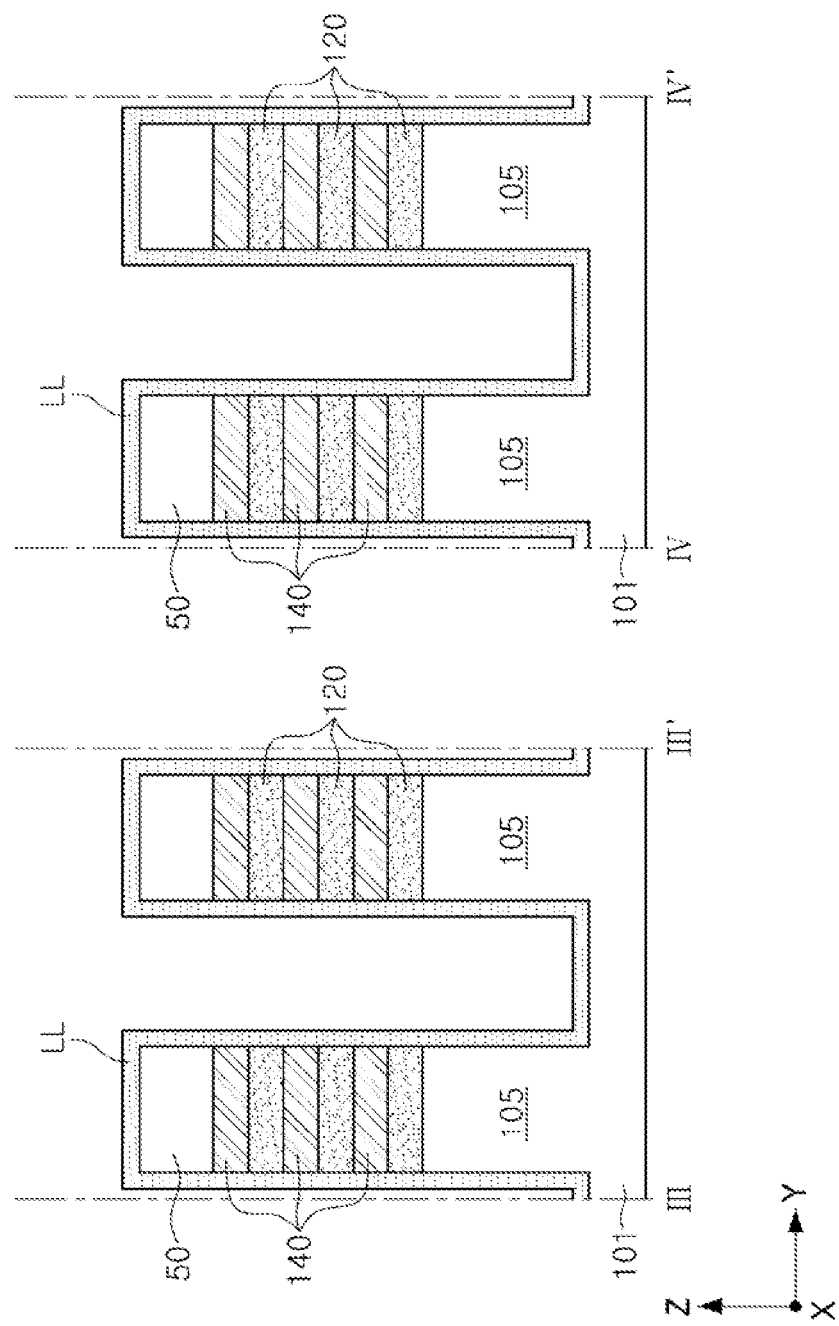
Figure 18A:
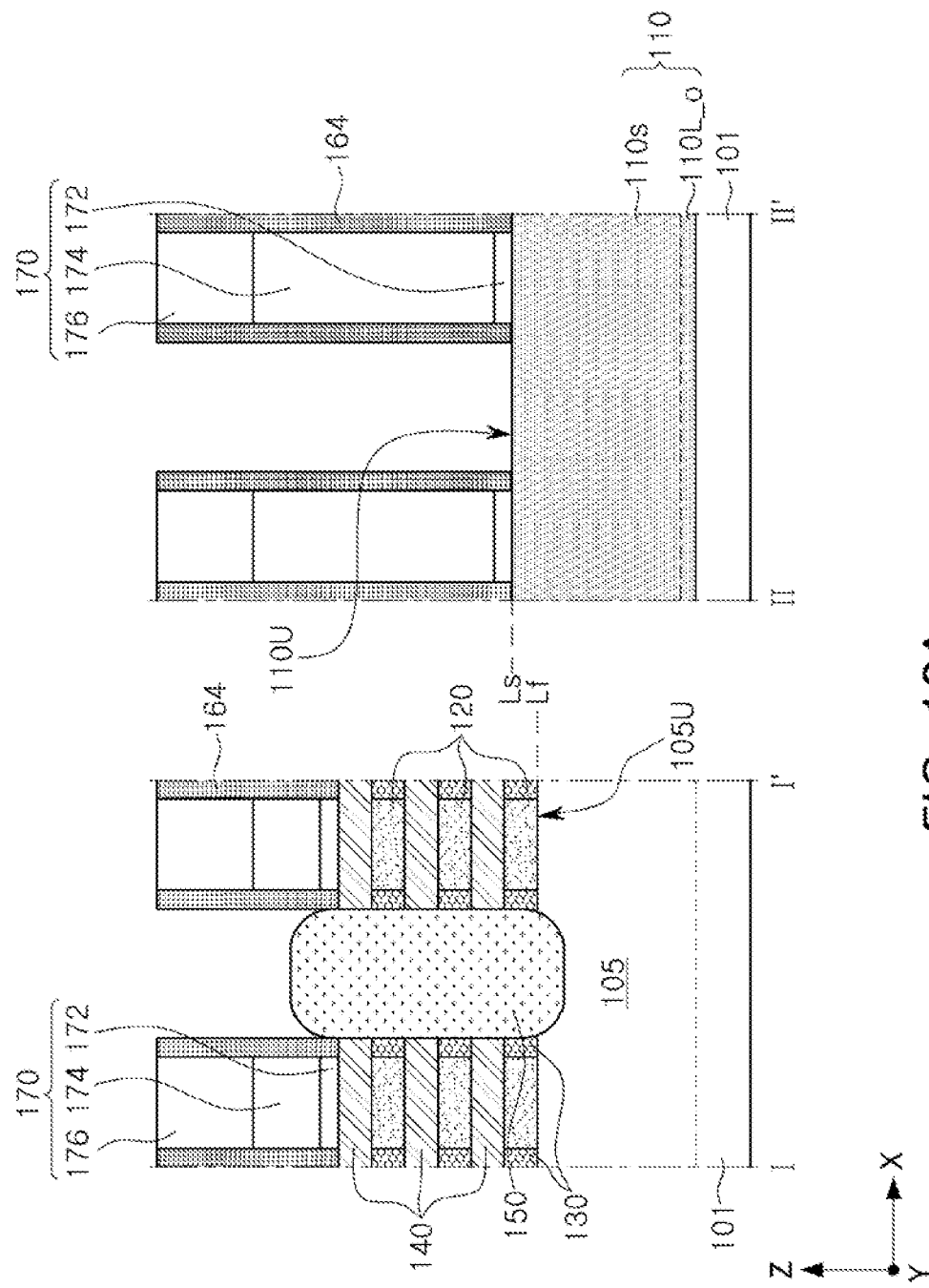
Figure 18B:
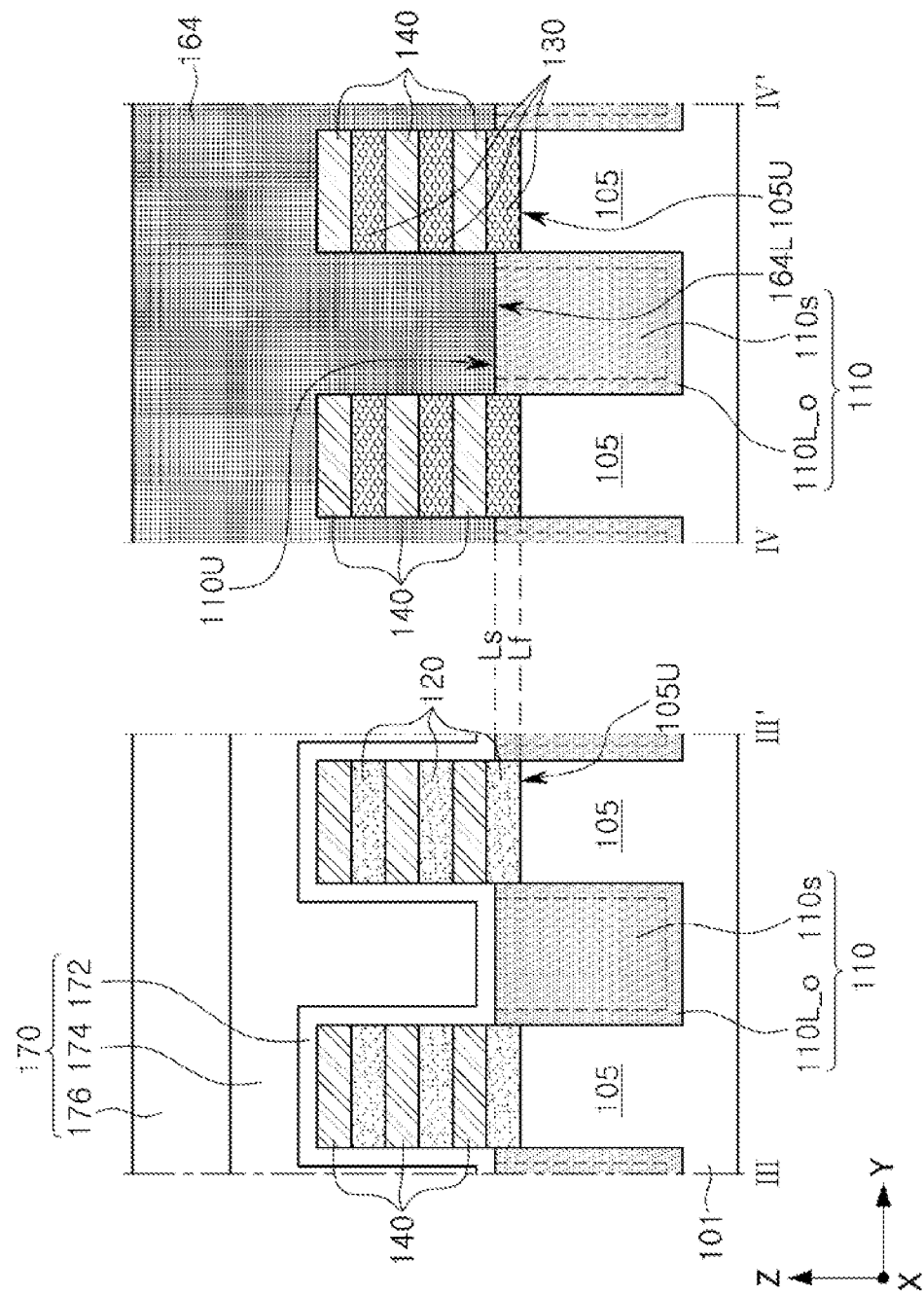
Figure 18C:
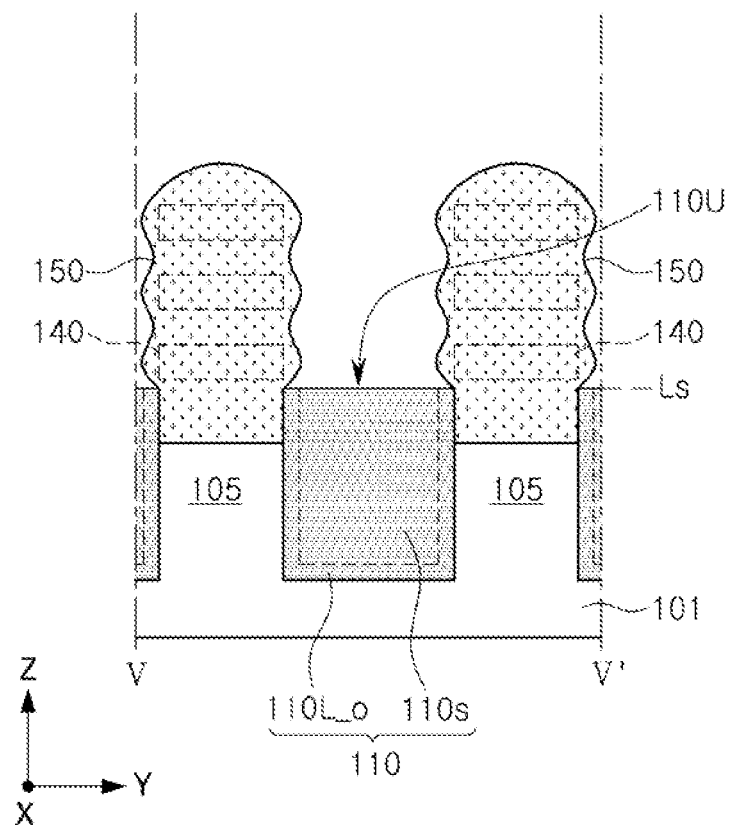
Figure 19:
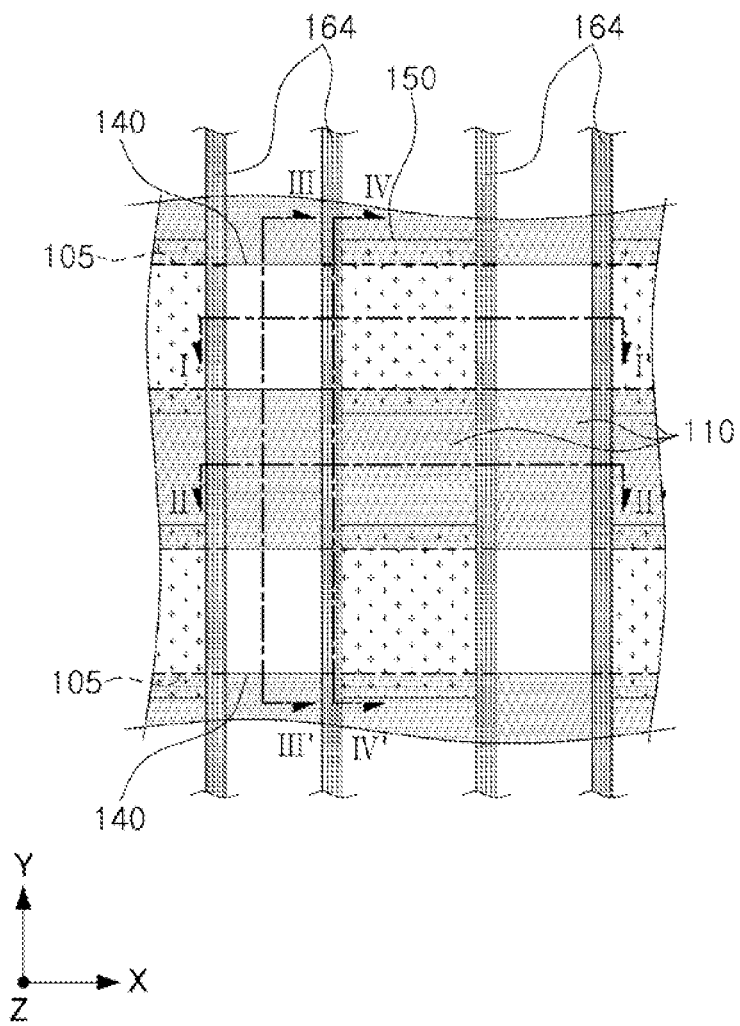

FIGS. 10a (11a), 13a, 15a (16a), 18a, 20a, and 22a illustrate cross-sectional surfaces taken along lines I-I' and II-II' in FIGS. 9, 12, 14, 17, 19, and 21 in process order. FIGS. 10b (11b), 13b, 15b (16b), 18b, 20b, and 22b illustrate cross-sectional surfaces taken along lines III-III and IV-IV' in process order. FIG. 18C illustrates a cross-sectional surface taken along V-V' in FIG. 17.

Referring to FIGS. 8, 9, 10A, and 10B, first layers and second layers may be alternately stacked on a substrate 101 (S10). The substrate 101, the first layers, and the second layers may be etched to form active fins 105, sacrificial layers 120, and channel layers 140 (S20), and a liner layer LL may be formed on the substrate 101 and the channel layers 140 (S30).

The sacrificial layers 120 on which the first layers are patterned may be replaced by a gate dielectric layer 161 and a gate electrode 163 through a subsequent process as illustrated in FIGS. 2A and 2B. The first layers may be formed of a material having etch selectivity with respect to the second layers. The second layers may include a material different from that of the first layers. The first and second layers may include, for example, a semiconductor material including at least one of silicon (Si), silicon germanium (SiGe), and germanium (Ge), may include different materials, and may or may not include impurities. For example, the sacrificial layers 120 on which the first layers are patterned may include silicon germanium (SiGe), and the channel layers 140 on which the second layers are patterned may include silicon (Si).

The first layers and the second layers may be formed by performing an epitaxial growth process using the substrate 101 as a seed. The number of layers and the stacked thickness of the first and second layers may be varied in the example embodiments.

After stacking the first and second layers, the substrate 101, the first layers, and the second layers may be etched using the mask pattern 50 as an etch mask. The active fins 105, the sacrificial layers 120, and the channel layers 140 may be formed in the form of lines extending in the X direction below the mask pattern 50. The mask pattern 50 may be formed of a carbon-containing material layer such as an amorphous carbon layer (ACL) or a spin-on hardmask (SOH).

The liner layer LL may be conformally formed on the substrate 101. The liner layer LL may cover side surfaces of the active fins 105 and side surfaces of the sacrificial layers 120 and the channel layers 140. The liner layer LL may cover the surface of the substrate 101 between the active fins 105 and may also cover an upper surface and side surfaces of the mask pattern 50. The liner layer LL may be formed of a semiconductor material, and may be formed of, for example, at least one of silicon (Si), germanium (Ge), and silicon-germanium (SiGe). In an example, the liner layer LL may be formed by performing an epitaxial growth process using the substrate 101, the active fins 105, the sacrificial layers 120, and the channel layers 140 as seeds. In this case, the liner layer LL may not be formed on the side surface and the upper surface of the mask pattern 50.

Figure 8:
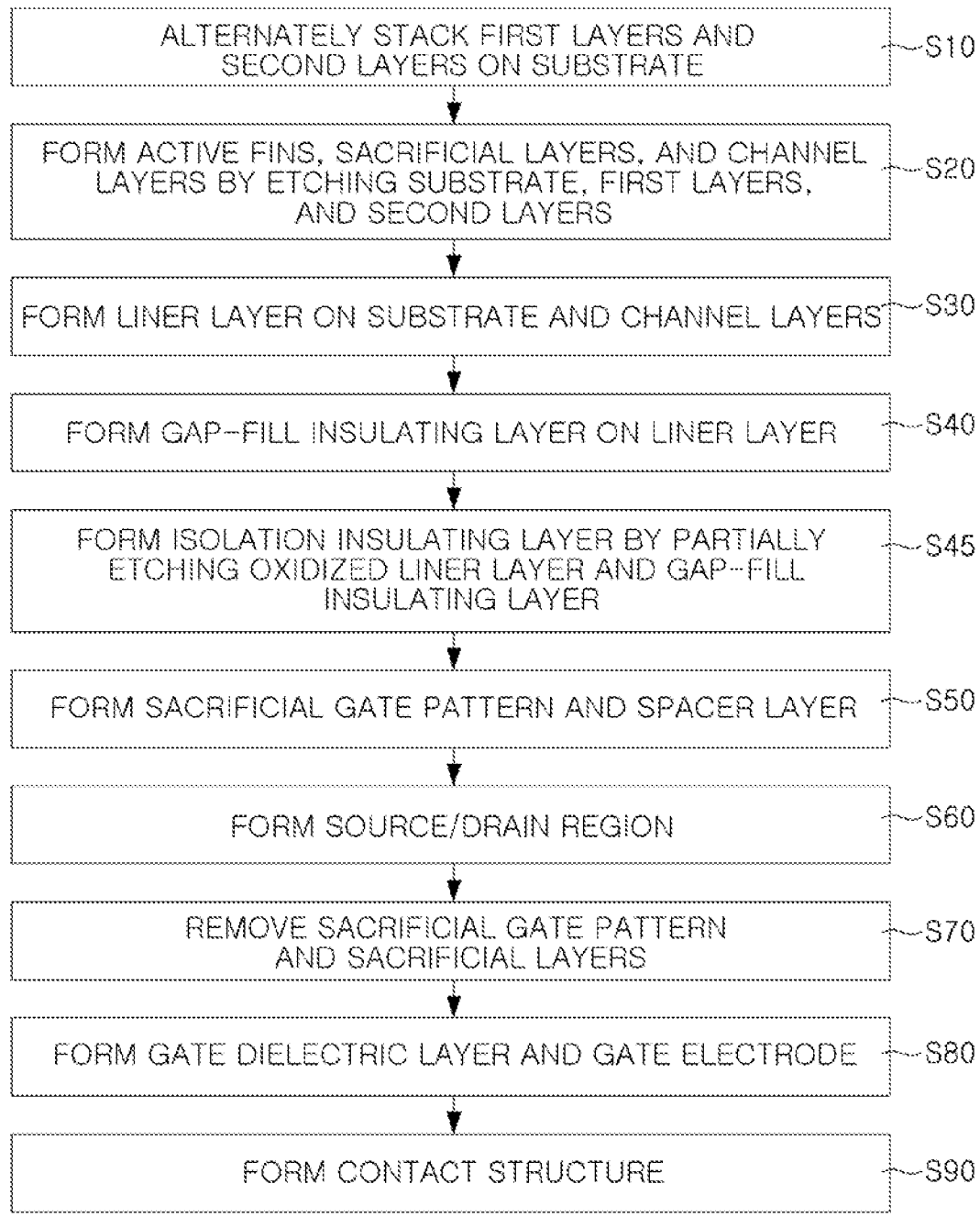
Figure 9:
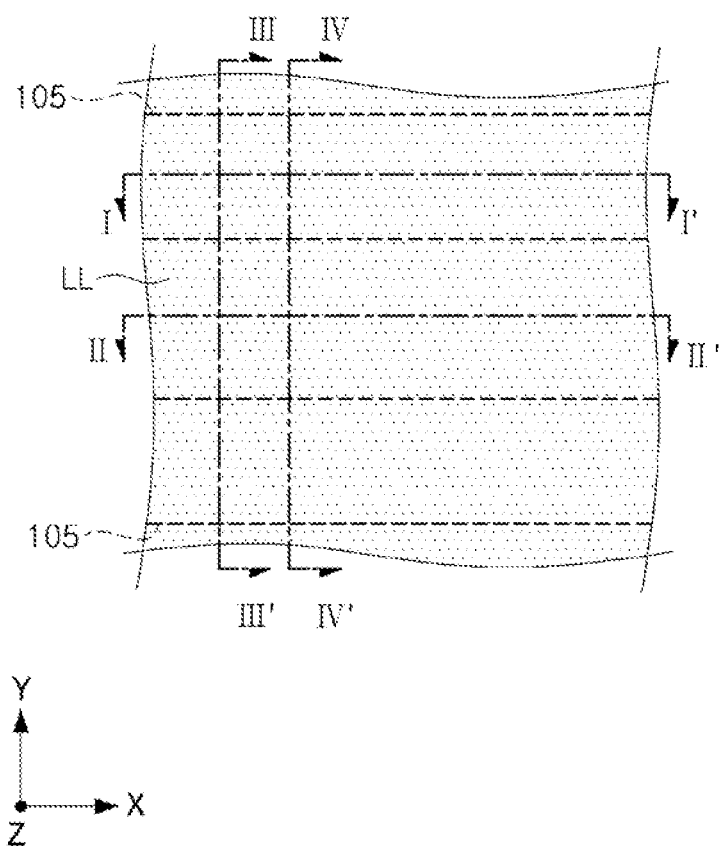
Figure 11A:
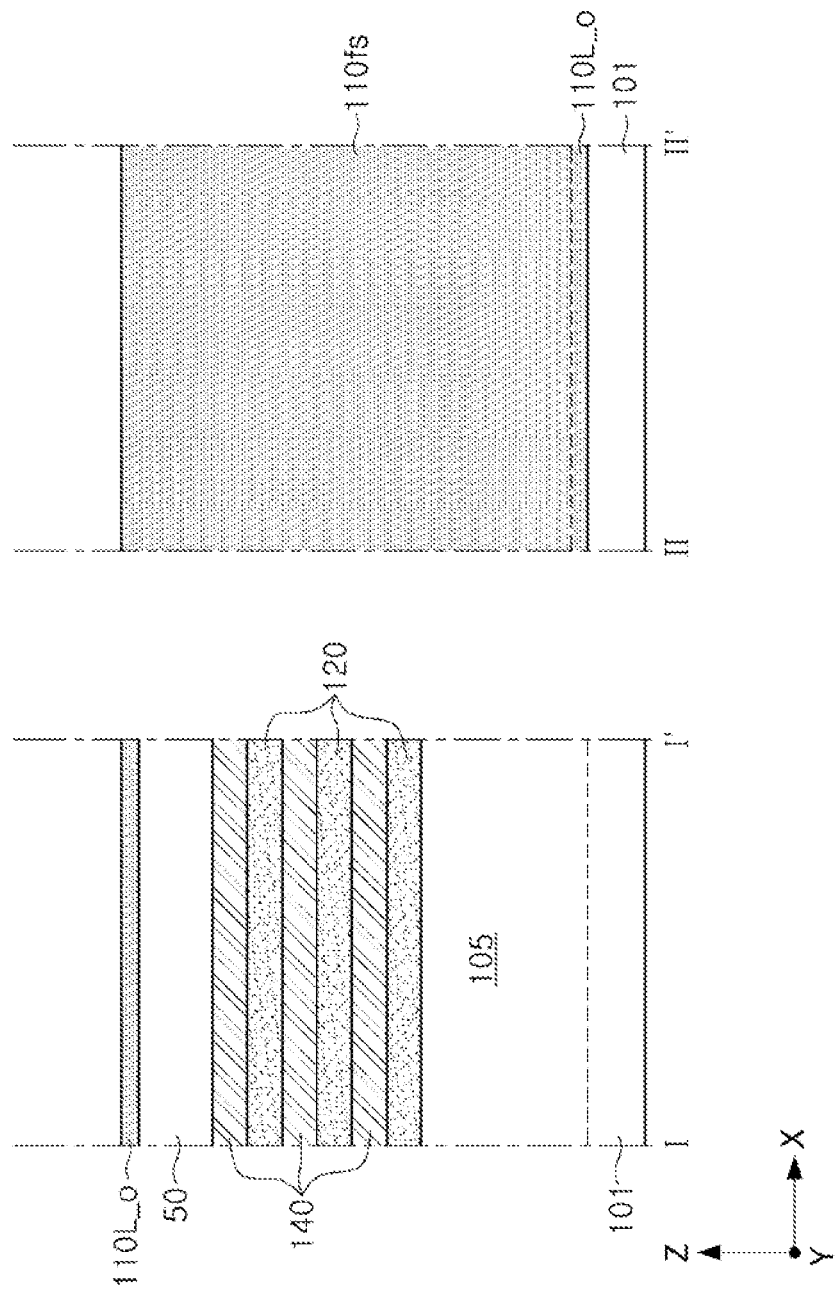
Figure 12:
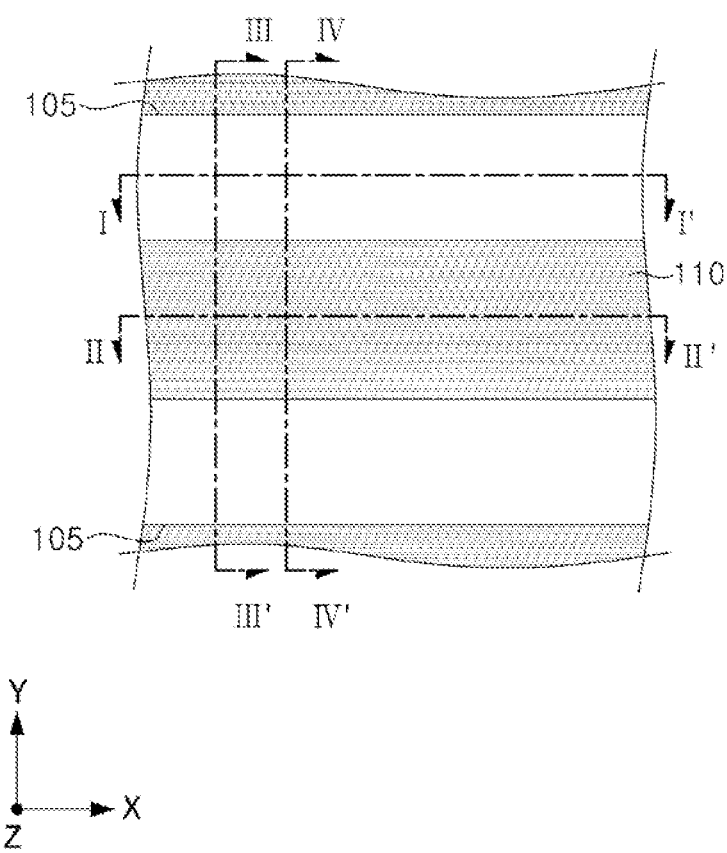

Referring to FIGS. 8, 11A, and 11B, a gap-fill insulating layer 110fs may be formed on the liner layer LL (S40).

The gap-fill insulating layer 110fs may fill a space not filled by the liner layer LL in a region between the active fins 105 and between the channel layers 140 (see, e.g., FIG. 11B). The gap-fill insulating layer 110fs may cover the liner layer LL. The gap-fill insulating layer 110fs may be formed using, for example, cyclic flowable chemical vapor deposition (cFCVD). After forming the gap-fill insulating layer 110fs, the liner layer LL may be oxidized and may be formed as a liner oxide region 110L_o in a wet annealing process. For example, when the liner layer LL is formed of silicon (Si), the liner oxide region 110L_o may include silicon oxide.

Referring to FIGS. 8, 12, 13A, and 13B, the isolation insulating layer 110 may be formed by partially etching the liner oxide region 110L_o, which are oxidized liner layers, and the gap-fill insulating layer 110fs (S45).

Figure 13A:
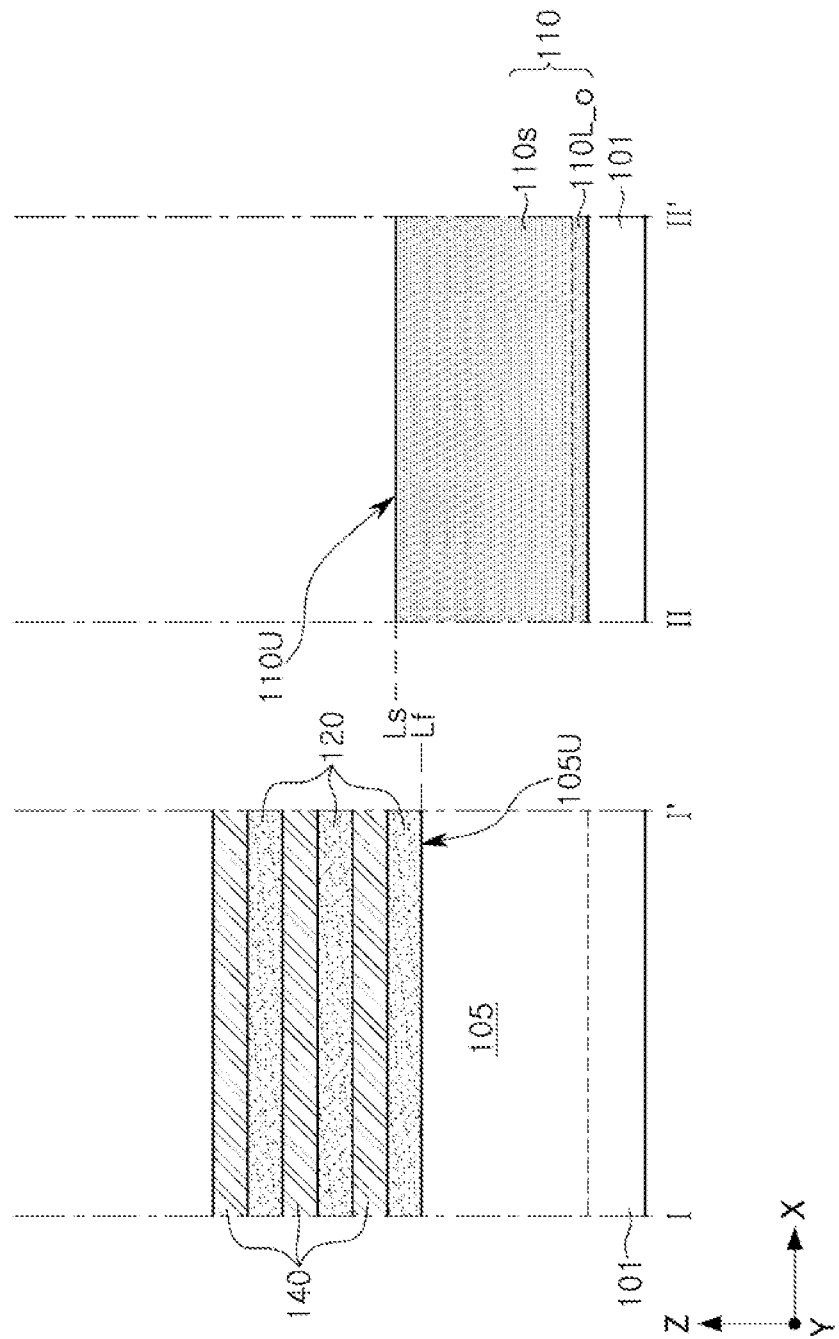
Figure 13B:
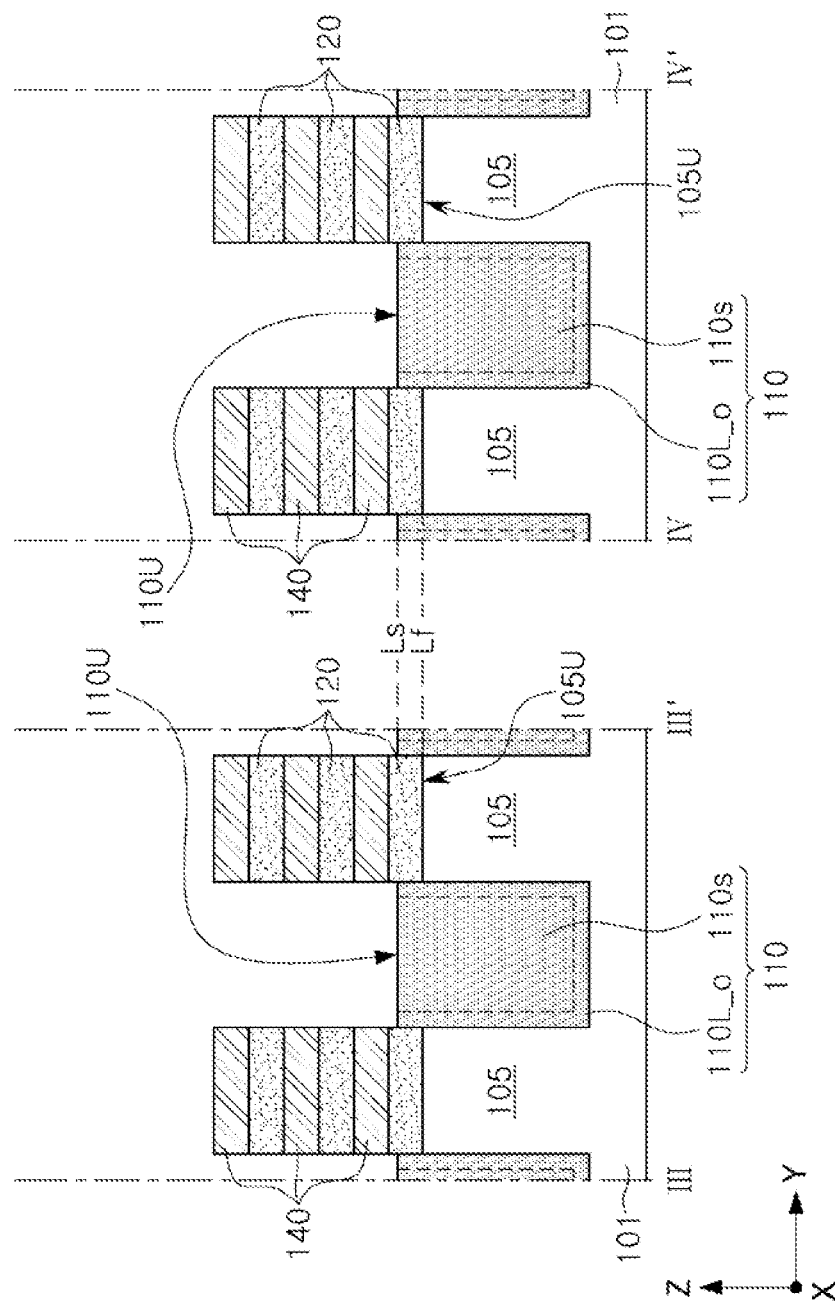
Figure 14:
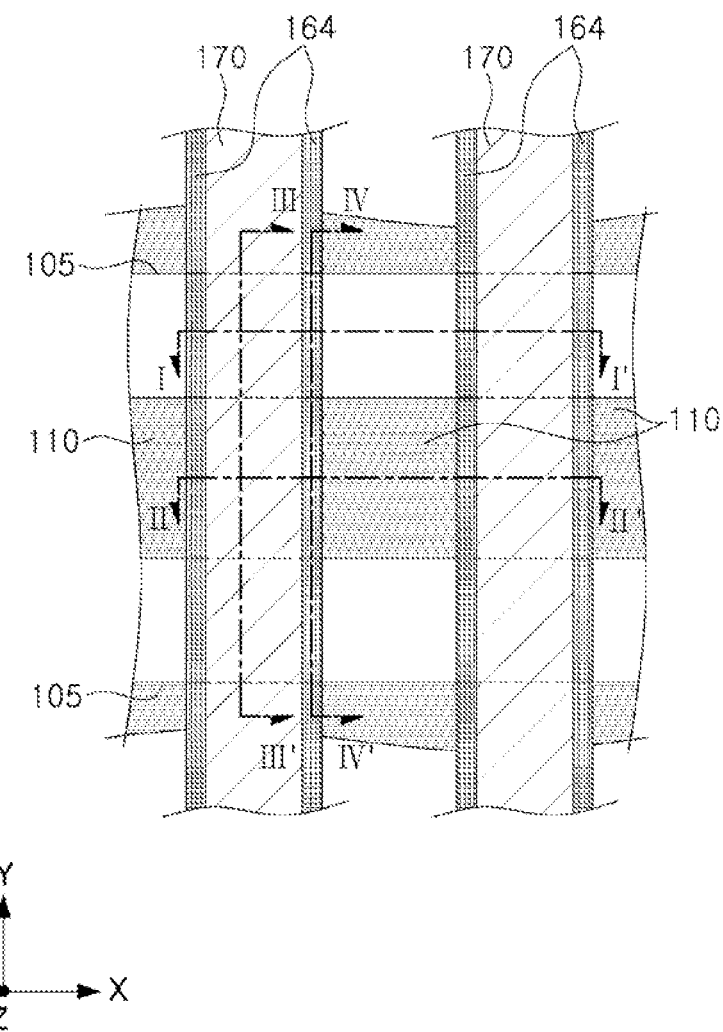
Figure 15A:
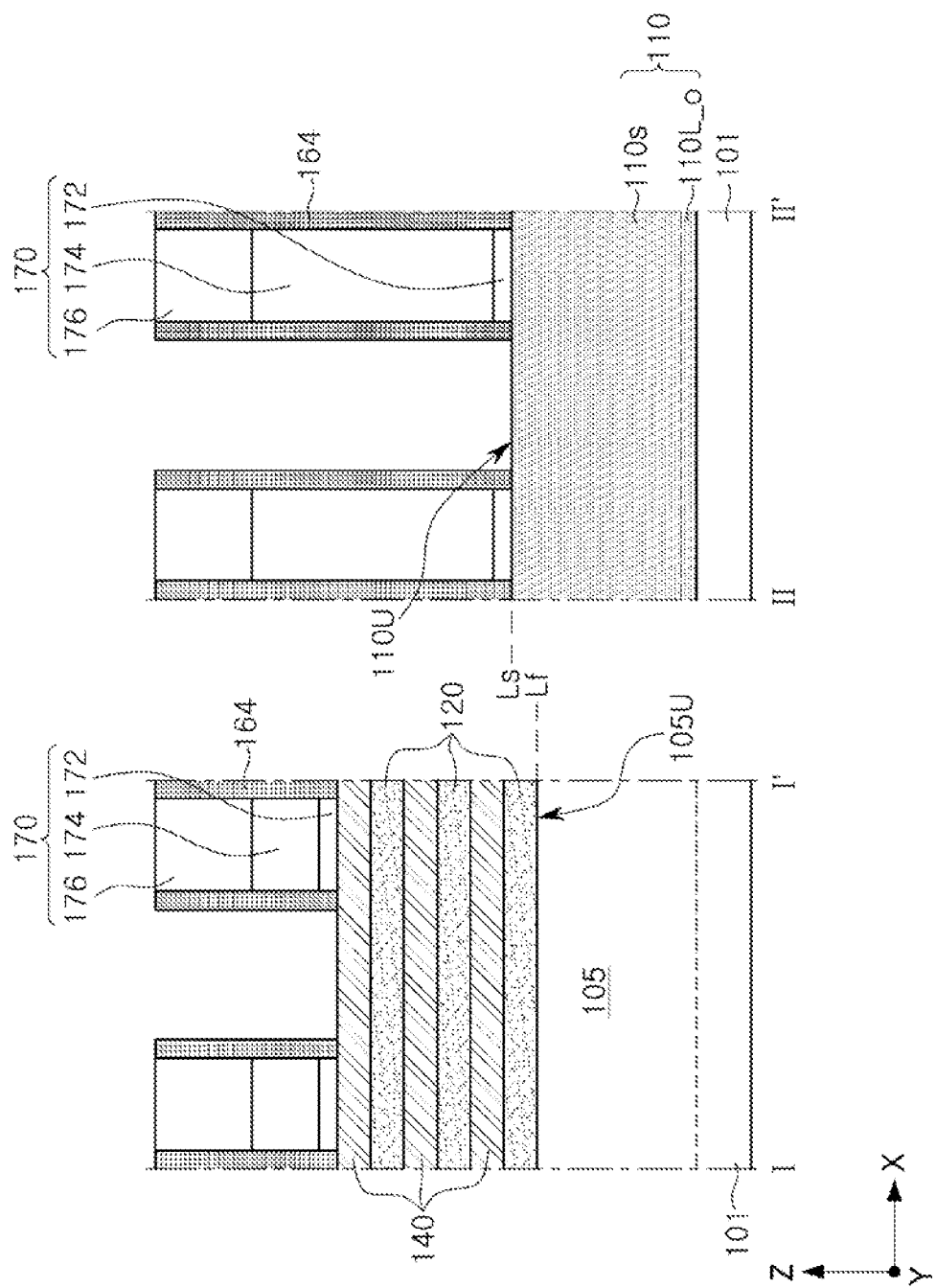
Figure 15B:
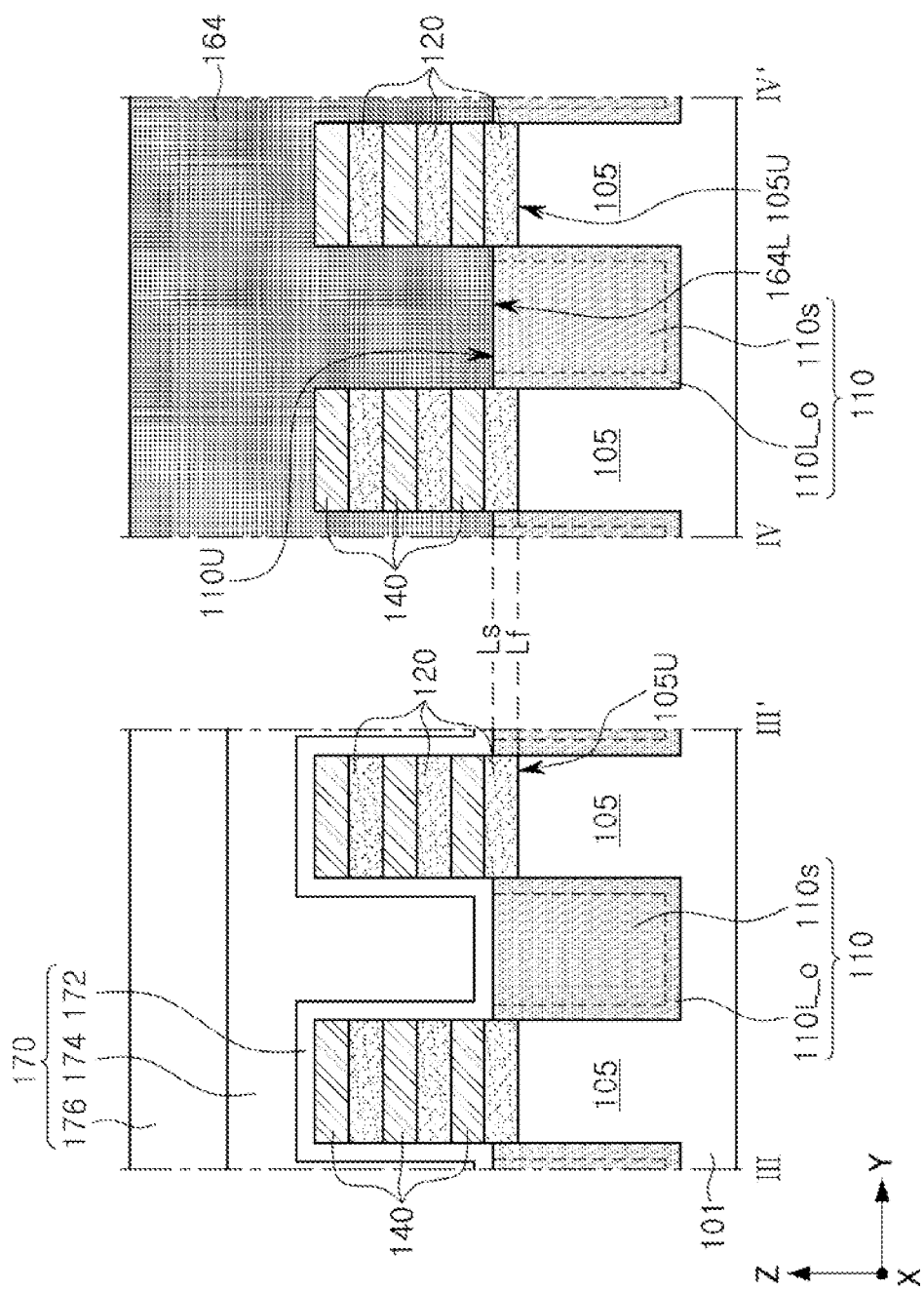

The liner oxide region 110L_o and the gap-fill insulating layer 110fs may be removed from an upper end by a predetermined depth (see, e.g., FIG. 13B). Accordingly, the isolation insulating layer 110 including the liner oxide region 110L_o and the gap-fill insulating region 110s may be formed. In this process, the isolation insulating layer 110 may be formed such that the upper surface 110U thereof may be disposed at a level higher than a level Lf of the upper surface 105U of the active fin 105 to have the raised regions Ra and Rb as illustrated in FIGS. 2A to 2C. The level of the upper surface 110U of the isolation insulating layer 110 may be varied in example embodiments. For example, the level Ls of the upper surface 110U may be disposed at a level of one of the channel layers 140. Since the liner oxide region 110L_o and the gap-fill insulating layer 110fs include the same material, an etching process may be performed to dispose the upper surface 110U of the isolation insulating layer 110 at a desired level without excessive etching. While forming the isolation insulating layer 110 or after forming the isolation insulating layer 110, the mask pattern 50 may be removed.

When the liner layer LL is formed of an insulating material including silicon nitride, a recess process may not be easily performed due to etch selectivity with the gap-fill insulating layer 110fs including silicon oxide. For example, when the liner layer LL is not sufficiently etched to expose the sacrificial layers 120 due to the etch selectivity, the sacrificial layers 120 may not be removed in a subsequent process, and when the liner layer LL is etched until the sacrificial layers 120 is exposed, the isolation insulating layer 110 may be excessively recessed, such that the area or volume of the gate electrode 163 may increase, which may lead to degradation of performance of the gate electrode 163.

Therefore, according to the manufacturing method in an example embodiment, since the liner layer LL is formed of a semiconductor material, and the liner layer LL is formed as the liner oxide region 110L_o by being oxidized in a subsequent process, the isolation insulating layer 110 may be formed of a single material, such as, only formed of silicon oxide, for example, excessive etching of the isolation insulating layer 110 may be prevented. Even though the liner oxide region 110L_o covers the side surfaces of the sacrificial layers 120, in a subsequent process of removing the sacrificial gate pattern 170 (see FIG. 20B), the isolation insulating layer 110 may be further recessed, and accordingly, the sacrificial layers 120 may be exposed.

Referring to FIGS. 8, 14, 15A, and 15B, the sacrificial gate pattern 170 and spacer layers 164 may be formed on the active fins 105 and the channel layers 140.

The sacrificial gate pattern 170 may be a sacrificial pattern formed in a region above the channel layers 140 in which the gate pattern 165 is disposed through a subsequent process, as illustrated in FIGS. 2A and 2B. The sacrificial gate pattern 170 may include first and second sacrificial gate layers 172 and 174 and a mask 176 stacked in order. The first and second sacrificial gate layers 172 and 174 may be patterned using the mask 176. The first and second sacrificial gate layers 172 and 174 may be an insulating layer and a conductive layer, respectively, but example embodiments thereof are not limited thereto, and the first and second sacrificial gate layers 172 and 174 may be integrated into a single layer. For example, the first sacrificial gate layer 172 may include silicon oxide, and the second sacrificial gate layer 174 may include polysilicon. The mask 176 may be formed of a carbon-containing material layer such as an amorphous carbon layer (ACL) or a spin-on hardmask (SOH). The sacrificial gate pattern 170 may have a line shape in which the sacrificial gate pattern 170 may intersect the active fins 105 and the channel layers 140 and may extend in one direction (e.g., the Y direction).

Spacer layers 164 may be formed on both sidewalls of the sacrificial gate pattern 170. The spacer layers 164 are formed by forming a film having a uniform thickness along the surfaces of the sacrificial gate pattern 170, the isolation insulating layer 110, the sacrificial layers 120, and the channel layers 140 and anisotropically etching the film. The spacer layers 164 may be formed such that the lower surface 164L thereof may be in contact with the isolation insulating layer 110, and the level Ls of the lower surface 164L may be disposed at a level higher than the level Lf of the upper surface 105U of the active fins 105. The spacer layers 164 may be formed of a low-k material, and may include, for example, at least one of SiO, SiN, SiCN, SiOC, SiON, and SiOCN.

Referring to FIGS. 8, 16A, 16B, 17, 18A, 18B, and 18C, a source/drain region 150 may be formed (S60).

Figure 16A:
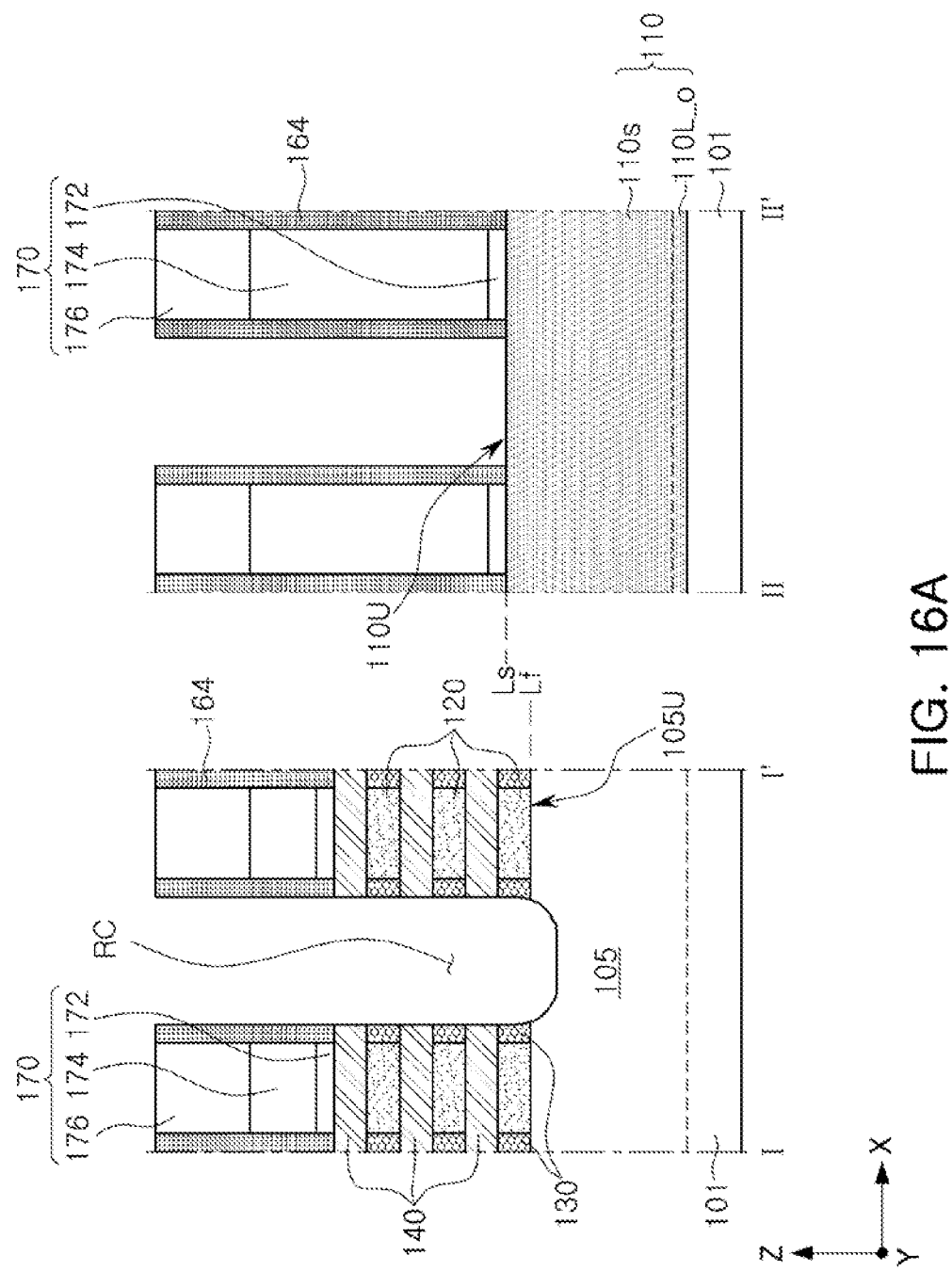
Figure 16B:
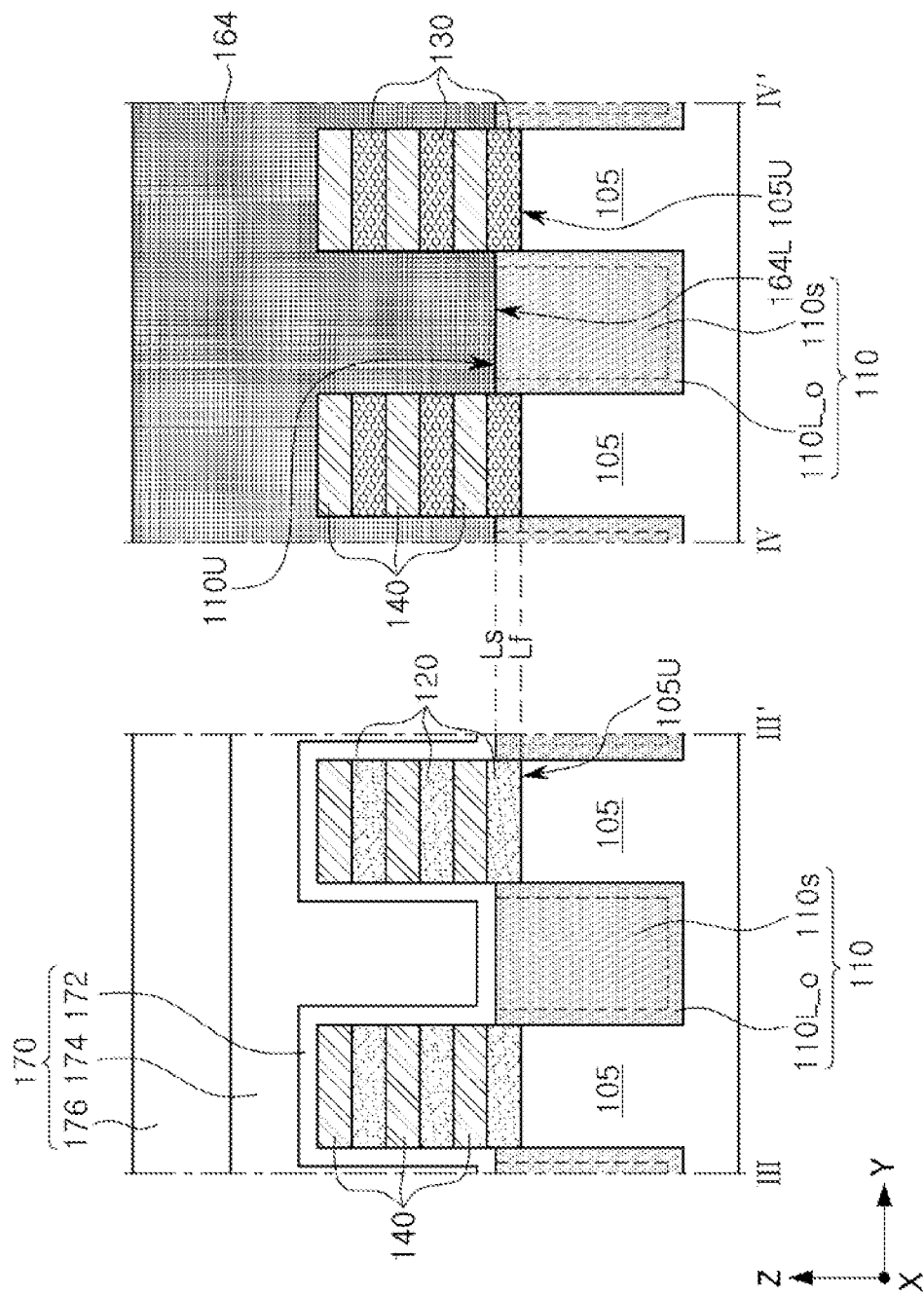
Figure 17:
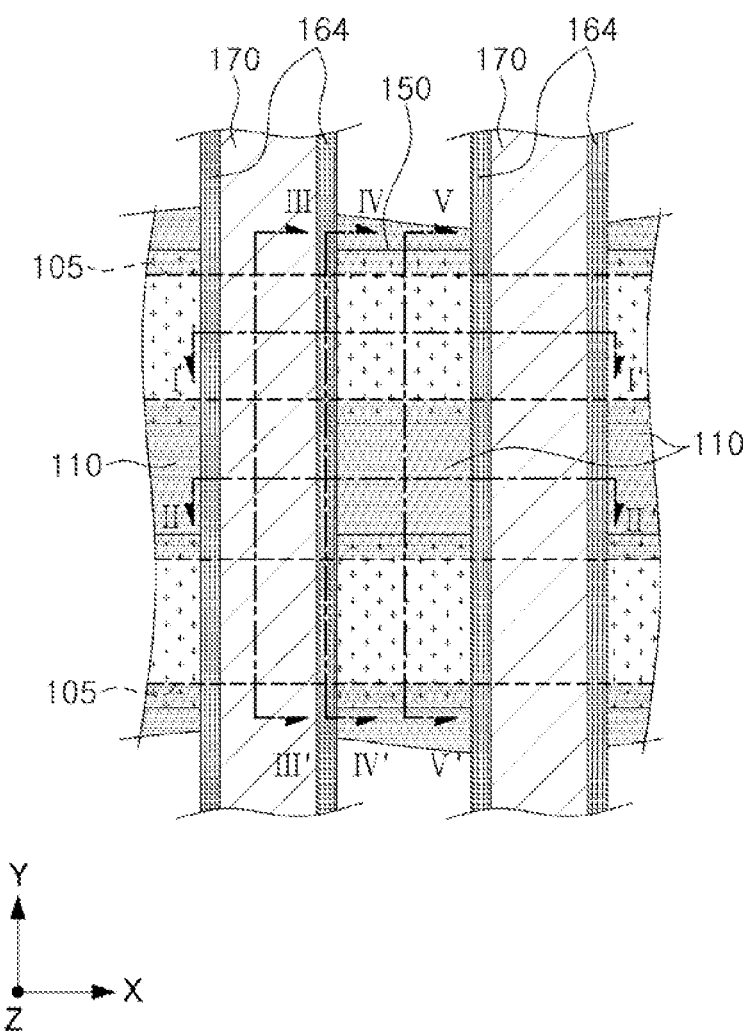

Referring to FIGS. 16A and 16B, a recess portion RC may be formed by removing the exposed portions of the sacrificial layers 120 and channel layers 140 between the external side of the sacrificial gate patterns 170 and the spacer layers 164. The recess portion RC may be partially recessed into the active fins 105. The exposed sacrificial layers 120 and channel layers 140 may be removed using the sacrificial gate patterns 170 and the spacer layers 164 as masks, and accordingly, the channel layers 140 may have a predetermined length in the X direction. The sacrificial layers 120 exposed by the recess portion RC may be partially removed from the side surface, and the inner spacer layers 130 may be formed in the region from which the sacrificial layers 120 are removed.

The sacrificial layers 120 may be selectively etched with respect to the channel layers 140 and may be partially removed from the side surface in the X direction. The inner spacer layers 130 may be formed by filling an insulating material in the region from which the sacrificial layers 120 are partially removed and removing the insulating material deposited on the external side of the channel layers 140. The inner spacer layers 130 may be formed of the same material as that of the spacer layers 164, but an example embodiment thereof is not limited thereto. For example, the inner spacer layers 130 may include at least one of SiN, SiCN, SiOCN, SiBCN, and SiBN. However, in example embodiments, the process of forming the inner spacer layers 130 may not be performed.

Referring to FIGS. 17, 18A, 18B, and 18C, on both sides of the sacrificial gate pattern 170, the source/drain regions 150 may be formed on the active fin 105 recessed by the recess portion RC. The source/drain regions 150 may be formed by performing an epitaxial growth process in the recess portion RC. The source/drain regions 150 may be connected to the channel layers 140 through side surfaces of the source/drain regions 150 and through side surfaces of the channel layers 140. The source/drain regions 150 may include impurities due to in-situ doping, and may include a plurality of layers having different doping elements and/or doping concentrations.

Referring to FIGS. 8, 19, 20A, and 20B, the sacrificial gate pattern 170 and the sacrificial layers 120 may be removed (S70).

An interlayer insulating layer 190 may be formed by forming an insulating material film covering the sacrificial gate pattern 170, the spacer layers 164, the source/drain regions 150, and the isolation insulating layer 110, and planarizing the insulating material film until an upper surface of the sacrificial gate pattern 170 is exposed.

The sacrificial gate pattern 170 and the sacrificial layers 120 may be selectively removed with respect to the spacer layers 164, the channel layers 140, and the inner spacer layers 130. The opening OP may be formed by removing the sacrificial gate pattern 170, and gap regions LR may be formed by removing the sacrificial layers 120 exposed through the opening OP (see, e.g., FIG. 20A). In this process, an upper portion of the isolation insulating layer 110 may be partially removed by the opening OP, and may be recessed further downwardly than the level Lf of the upper surface 105U of the active fin 105. Accordingly, the sacrificial layers 120 may be exposed in the opening OP. However, a region other than the opening OP, the upper surface 110U of the isolation insulating layer 110 in contact with the lower surface 164L of the spacer layer 164, for example, may maintain the level Ls.

Referring to FIGS. 8, 21, 22A, and 22B, a gate dielectric layer 161 and a gate electrode 163 may be formed (S80).

The gate dielectric layer 161 may be formed to conformally cover internal surfaces of the opening OP and the gap regions LR. The opening OP and the gap regions LR may be completely embedded by the gate electrode 163, and a portion of the gate electrode 163 may be removed from the upper portion of the opening OP by a predetermined depth. A gate capping layer 166 may be formed in a region of the opening OP from which the gate electrode 163 is removed. Accordingly, the gate structure 160 including the gate dielectric layer 161, the gate electrode 163, the spacer layers 164, and the gate capping layer 166 may be formed.

Referring to FIGS. 8, 2A, 2B, and 2C, a contact structure 180 may be formed (S90). A contact hole may be formed by patterning the interlayer insulating layer 190, and the contact hole may be filled with a conductive material, thereby forming a contact plug 185. Before forming the contact plug 185, a metal-semiconductor compound layer 181 may be formed in the source/drain region 150 exposed through the contact hole. Forming the contact plug 185 may include forming the barrier layer 185A and the plug layer 185B in order. A lower surface of the contact hole may be recessed into the source/drain regions 150 or may have a curve along the upper surface of the source/drain regions 150. In example embodiments, the shape and arrangement of the contact plug 185 may be varied. Accordingly, the semiconductor device 100 in FIGS. 1 to 2C may be manufactured.

According to the aforementioned example embodiments, by disposing a portion of the isolation insulating layer at a level higher than a level of the upper surface of the active fin, a semiconductor device having improved electrical properties and reliability may be provided.

While example embodiments have been illustrated and described above, it will be apparent to those skilled in the art that modifications and variations could be made without departing from the scope of the present disclosure as defined by the appended claims.

What is claimed is:

1. A semiconductor device comprising:
a plurality of active fins extending in a first direction on a substrate;
an isolation insulating layer provided between adjacent active fins of the plurality of active fins on the substrate and covering at least a portion of side surfaces of the plurality of active fins;
a plurality of channel layers stacked vertically and spaced apart from each other on the plurality of active fins;
a gate pattern extending in a second direction across the plurality of active fins and the plurality of channel layers on the substrate, the gate pattern surrounding at least a portion of each of the plurality of channel layers;
a plurality of spacer layers extending in the second direction across the plurality of active fins on both sides of the gate pattern; and
a plurality of source/drain regions provided on the plurality of active fins on both sides of the gate pattern, each of the plurality of source/drain regions being connected to a respective one of the plurality of channel layers,
wherein at least one of the plurality of spacer layers extends downwardly along a side surface of the gate pattern such that a lower surface of the at least one of the plurality of spacer layers is in contact with an upper surface of the isolation insulating layer, and the lower surface of the at least one of the plurality of spacer layers is at a level higher than a level of upper surfaces of the plurality of active fins, and
wherein the gate pattern has a lower surface contacting the isolation insulating layer, and the lower surface of the gate pattern is at a level lower than the level of the upper surfaces of the plurality of active fins.

2. The semiconductor device of claim 1, wherein the isolation insulating layer comprises a raised region extending between the adjacent active fins at a level higher than a level of the lower surface of the gate pattern.

3. The semiconductor device of claim 2, wherein an upper surface of the raised region of the isolation insulating layer is at a level higher than the level of the upper surfaces of the plurality of active fins.

4. The semiconductor device of claim 2, wherein the raised region of the isolation insulating layer comprises a first region at a level higher than the level of the lower surface of the gate pattern and a second region at a level higher than the level of the upper surfaces of the plurality of active fins.

5. The semiconductor device of claim 4, wherein a portion of an upper surface of the second region of the raised region contacts the lower surface of the at least one of the plurality of spacer layers at a level higher than the level of the upper surfaces of the plurality of active fins.

6. The semiconductor device of claim 2, wherein a level difference between an upper surface of one of the plurality of active fins and an upper surface of the raised region of the isolation insulating layer in a vertical direction is greater than about 0 nm and equal to or less than about 10 nm.

7. The semiconductor device of claim 1, wherein an upper surface of the isolation insulating layer comprises a concave portion in a region between the adjacent active fins of the plurality of active fins, the concave portion being concave toward the substrate.

8. The semiconductor device of claim 1, wherein the gate pattern comprises a gate electrode and a gate dielectric layer, and
wherein the gate dielectric layer is provided between the gate electrode and the plurality of active fins, between the gate electrode and the plurality of channel layers, and between the gate electrode and the isolation insulating layer.

9. The semiconductor device of claim 8, wherein the gate dielectric layer extends downwardly further than the lower surface of the at least one of the plurality of spacer layers.

10. The semiconductor device of claim 8, wherein the isolation insulating layer contacts a side surface and a lower surface of the gate dielectric layer below the lower surface of the at least one of the plurality of spacer layers.

11. The semiconductor device of claim 1, further comprising:
an interlayer insulating layer provided on the plurality of source/drain regions and the isolation insulating layer; and
a plurality of contact structures penetrating the interlayer insulating layer and electrically connected to the plurality of source/drain regions.

12. The semiconductor device of claim 11, wherein a lower surface of the interlayer insulating layer contacts the isolation insulating layer on an external side of the plurality of active fins, and
wherein the lower surface of the interlayer insulating layer is at a level higher than the level of the upper surfaces of the plurality of active fins.

13. A semiconductor device comprising:
an active fin protruding from a substrate and extending in a first direction;
an isolation insulating layer covering side surfaces of the active fin that extend in the first direction, the isolation insulating layer comprising a raised region having a surface at a level higher than a level of an upper surface of the active fin;
a plurality of channel layers vertically provided and spaced apart from each other on the active fin;
a gate pattern extending across the active fin and the plurality of channel layers in a second direction on the substrate;
a spacer layer extending across the active fin in the second direction on at least one side of the gate pattern; and
a source/drain region disposed on a recessed region of the active fin and connected to the plurality of channel layers on at least one side of the gate pattern,
wherein the spacer layer extends downwardly along respective side surfaces of the plurality of channel layers and a lower surface of the spacer layer contacts an upper surface of the raised region of the isolation insulating layer, and
wherein the lower surface of the spacer layer is at a level higher than the level of the upper surface of the active fin.

14. The semiconductor device of claim 13, wherein the raised region of the isolation insulating layer extends between the active fin and another active fin, and comprises a first region at a level higher than a level of a lower surface of the gate pattern and a second region at a level higher than the level of the upper surface of the active fin.

15. The semiconductor device of claim 14, wherein the lower surface of the gate pattern is in contact with the isolation insulating layer, and the lower surface of the gate pattern is at a level lower than a level of the lower surface of the spacer layer.

16. The semiconductor device of claim 13, wherein the isolation insulating layer comprises a liner oxide region and a gap-fill insulating region on the liner oxide region,
   wherein the liner oxide region is provided along a side surface and a bottom surface of the isolation insulating layer; and
   wherein the liner oxide region and the gap-fill insulating region comprise a same insulating material.

17. The semiconductor device of claim 13, wherein the gate pattern comprises a gate electrode and a gate dielectric layer,
   wherein the gate dielectric layer is provided between the gate electrode and the active fin, between the gate electrode and the plurality of channel layers, and between the gate electrode and the isolation insulating layer, and
   wherein the gate dielectric layer extends downwardly further than the lower surface of the spacer layer and in contact with the raised region of the isolation insulating layer.

18. The semiconductor device of claim 13, wherein the lower surface of the spacer layer directly contacts the upper surface of the raised region of the isolation insulating layer.

19. A semiconductor device comprising:
   a first active fin and a second active fin extending in a first direction on a substrate;
   an isolation insulating layer provided between a side surface of the first active fin and a side surface of the second active fin facing each other;
   a first channel structure comprising a plurality of first channel layers stacked vertically and spaced apart from each other on the first active fin;
   a second channel structure comprising a plurality of second channel layers stacked vertically and spaced apart from each other on the second active fin;
   a gate pattern extending in a second direction across the first and second active fins, the gate pattern surrounding at least a portion of the first channel structure and at least a portion of the second channel structure; and
   a spacer layer extending across the first active fin and the second active fin in the second direction on both sides of the gate pattern, the spacer layer having a lower surface in contact with an upper surface of the isolation insulating layer in a region between the first active fin and the second active fin,
   wherein the lower surface of the spacer layer in contact with the upper surface of the isolation insulating layer is at a level higher than a level of an upper surface of at least one of the first active fin and the second active fin.

20. The semiconductor device of claim 19, wherein the isolation insulating layer comprises a raised region having a surface at a level higher than a level of an upper surface of the first active fin and an upper surface of the second active fin in the region between the first active fin and the second active fin.

* * * * *